United States Patent
Tipirneni et al.

(10) Patent No.: US 9,853,140 B2
(45) Date of Patent: Dec. 26, 2017

(54) ADAPTIVE CHARGE BALANCED MOSFET TECHNIQUES

(71) Applicant: Vishay-Siliconix, Santa Clara, CA (US)

(72) Inventors: Naveen Tipirneni, Santa Clara, CA (US); Deva N. Pattanayak, Saratoga, CA (US)

(73) Assignee: Vishay-Siliconix, Santa Clara, CA (US)

( * ) Notice: Subject to any disclaimer, the term of this patent is extended or adjusted under 35 U.S.C. 154(b) by 665 days.

(21) Appl. No.: 13/732,284

(22) Filed: Dec. 31, 2012

(65) Prior Publication Data

US 2014/0183624 A1   Jul. 3, 2014

(51) Int. Cl.
| | |
|---|---|
| H01L 29/78 | (2006.01) |
| H01L 29/66 | (2006.01) |
| H01L 29/40 | (2006.01) |
| H01L 29/06 | (2006.01) |
| H01L 21/265 | (2006.01) |

(52) U.S. Cl.
CPC ...... *H01L 29/7813* (2013.01); *H01L 29/0623* (2013.01); *H01L 29/0634* (2013.01); *H01L 29/404* (2013.01); *H01L 29/407* (2013.01); *H01L 29/66734* (2013.01); *H01L 21/26586* (2013.01)

(58) Field of Classification Search
CPC ............... H01L 29/7813; H01L 29/407; H01L 29/66727; H01L 29/66734; H01L 29/7811; H01L 29/456; H01L 29/42376
See application file for complete search history.

(56) References Cited

U.S. PATENT DOCUMENTS

| | | | |
|---|---|---|---|
| 6,252,288 B1 | 6/2001 | Chang | |
| 7,582,519 B2 | 9/2009 | Kocon et al. | |
| 8,546,893 B2 | 10/2013 | Darwish et al. | |
| 8,829,605 B2 | 9/2014 | Masuda et al. | |
| 9,024,382 B2 | 5/2015 | Kitagawa | |
| 9,099,553 B2 | 8/2015 | Masuda et al. | |
| 2002/0005549 A1 | 1/2002 | Saito et al. | |
| 2003/0052383 A1 | 3/2003 | Nemoto et al. | |
| 2004/0245570 A1 | 12/2004 | Ninomiya | |
| 2007/0048958 A1* | 3/2007 | Liao | H01L 29/66795 438/369 |
| 2008/0164516 A1* | 7/2008 | Darwish | H01L 29/0649 257/329 |

(Continued)

FOREIGN PATENT DOCUMENTS

| | | |
|---|---|---|
| CN | 1605119 | 4/2005 |
| JP | 2007529115 | 10/2007 |

(Continued)

*Primary Examiner* — Michael Carter
*Assistant Examiner* — Mohammed R Alam

(57) ABSTRACT

An adaptive charge balanced MOSFET device includes a field plate stacks, a gate structure, a source region, a drift region and a body region. The gate structure includes a gate region surrounded by a gate insulator region. The field plate stack includes a plurality of field plate insulator regions, a plurality of field plate regions, and a field ring region. The plurality of field plates are separated from each other by respective field plate insulators. The body region is disposed between the gate structure, the source region, the drift region and the field ring region. Each of two or more field plates are coupled to the field ring.

14 Claims, 25 Drawing Sheets

(56) References Cited

U.S. PATENT DOCUMENTS

| | | | |
|---|---|---|---|
| 2008/0272429 A1 | 11/2008 | Ishiguro | |
| 2010/0264486 A1 | 10/2010 | Denison | |
| 2011/0095359 A1 | 4/2011 | Tipirneni | |
| 2011/0298042 A1* | 12/2011 | Tu | H01L 29/0634 257/330 |
| 2012/0032258 A1 | 2/2012 | Zeng | |
| 2012/0043602 A1* | 2/2012 | Zeng | H01L 29/0623 257/330 |
| 2012/0061753 A1 | 3/2012 | Nishiwaki | |
| 2012/0319199 A1 | 12/2012 | Zeng | |

FOREIGN PATENT DOCUMENTS

| | | |
|---|---|---|
| WO | 2005065385 | 7/2005 |
| WO | 2014106127 | 7/2014 |

* cited by examiner

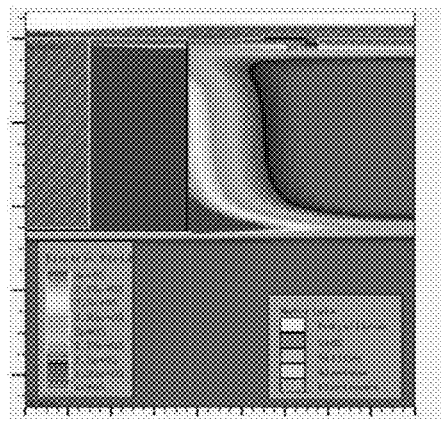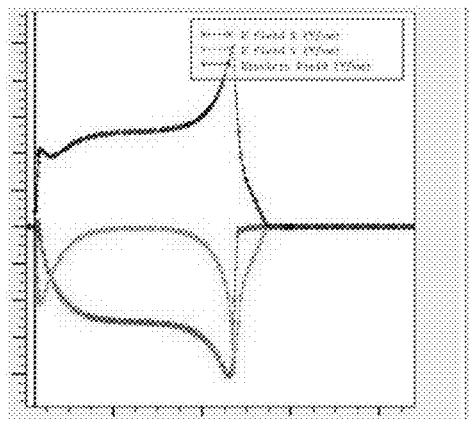
Figure 7
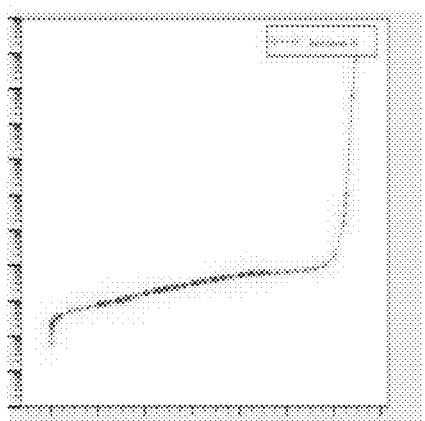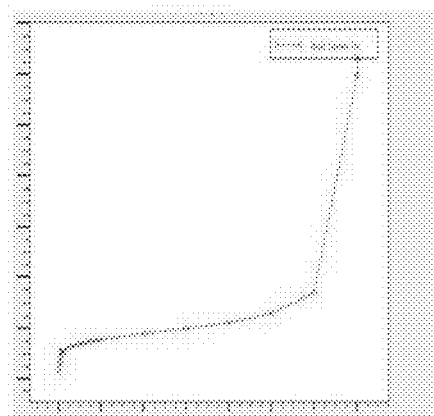
Figure 8A					Figure 8B

ADAPTIVE CHARGE BALANCED MOSFET TECHNIQUES

BACKGROUND OF THE INVENTION

An important circuit element of most electronic circuits is the transistor. There are numerous transistor families, such as bipolar junction transistors and field effect transistors. One important transistor family is the metal-oxide-semiconductor field effect transistors (MOSFET). There are MOSFETs for use in small signal applications and other designed for power applications. A common power MOSFET is the vertical or trench MOSFET. Referring to FIG. 1, a basic trench MOSFET according to the conventional art is shown. The topology of the illustrated trench MOSFET 100 is commonly referred to as a griped cell MOSFET. The striped trench MOSFET 100 comprises a source contact (not shown), a plurality of source regions 110, a plurality of gate regions 115, a plurality of gate insulator regions 120, a plurality of body regions 125, a drift region 130, a drain region 135, and drain contact (not shown).

The body regions 125 are disposed above the drift region 130 opposite the drain region 135. The source regions 110, gate regions 115 and the gate insulator regions 120 are disposed within the body regions 125. The gate regions 115 and the gate insulator regions 120 are formed as substantially parallel-elongated structures. Each gate insulator region 120 surrounds a corresponding gate region 115, electrically isolating the gate region 115 from the surrounding regions 110, 125, 130. The gate regions 115 are coupled to form a common gate of the device 100. The source regions 110 are formed as substantially parallel-elongated structures along the periphery of the gate insulator regions 120. The source regions 110 are coupled together to form a common source of the device 100, by the source contact. The source contact also couples the source regions 110 to the body regions 125.

The source regions 110 and the drain region 135 are heavily n-doped (N+) semiconductor, such as silicon doped with phosphorous or arsenic. The drift region 130 is lightly n-doped (N−) semiconductor, such as silicon doped with phosphorous or arsenic. The body regions 125 are p-doped (P) semiconductor, such as silicon doped with boron. The gate regions 115 are heavily n-doped (N+) semiconductor, such as polysilicon doped with phosphorous. The gate insulator regions 120 may be a dielectric, such as silicon dioxide.

When the potential of the gate regions 115, with respect to the source regions 110, is increased above the threshold voltage of the device 100, a conducting channel is induced in the body region 125 along the periphery of the gate insulator regions 120. The striped trench MOSFET 100 will then conduct current between the drain region 135 and the source regions 110. Accordingly, the device 100 is in its on state.

When the potential of the gate regions 125 is reduced below the threshold voltage, the channel is no longer induced. As a result, a voltage potential applied between the drain region 135 and the source regions 110 will not cause current to flow there between. Accordingly, the device 100 is in its off state and the junction formed by the body region 125 and the drain region 135 supports the voltage applied across the source and drain.

The channel width of the striped trench MOSFET 100 is a function of the width of the plurality of the source regions 110. Thus, the striped trench MOSFET 100 provides a large channel width to length ratio. Therefore, the striped trench MOSFET may advantageously be utilized for power MOSFET applications, such as switching elements in a pulse width modulation (PWM) voltage regulator.

In the conventional art, there are numerous variations of the MOSFET made to improve the performance of the device. For example, the trench MOSFET may be modified to include a super-junction, a source shield with thick oxide, a reduce conductor path to the drain in combination with a thick gate-to-drain oxide, and the like.

A super-junction MOSFET can achieve an On-state resistance value below the limit of silicon for a given semi-infinite planar junction breakdown voltage. The presence of the alternative p-n regions allows the increase of drift region doping, depending on p-n region widths. The drift region doping can be increased by reducing the p and n region widths to maintain low lateral electric fields needed to maintain breakdown voltages. However, the lateral p-n junction regions limit the achievable conductive drift region widths due to the existence of built in depletion regions. This makes super-junction based MOSFET devices less advantageous for low voltage power MOSFETs (e.g., 30V or less) where epitaxial doping increments needed to see a decrease in total On-state resistance primarily composed of channel resistance is more. For high voltage power MOSFETs (e.g., 150V or more), multiple epitaxial or trench refill techniques are used to fabricate alternate p-n regions makes achieving narrow n-region widths for deeper p-n unction regions challenging and expensive.

At relatively low voltages (e.g., 150V or less), to overcome the problems associated with using vertical p-n junction resurface regions and be able to reduce On-state resistance below silicon limits, lateral depletion of additional n-doping is achieved using gate or source connected shielding structures surrounding the n-epitaxial region are employed. However, devices based on such shield techniques need thicker oxide layer (e.g., 0.5 um or more) between the gate or source shield structures and silicon to achieve higher breakdown voltages e.g., 150V or more). The technologically challenging thicker oxides in a trench, needed to achieve high breakdown voltages, is a significant barrier in utilizing such shield techniques. Furthermore, shield techniques showing low On-state resistance inevitably increase the device capacitance and hence charge needed to switch the transistor on and off resulting in increase switching loss. Similar drawbacks are experienced, by gate-to-drain thick oxide techniques. As a result, shield technique MOSFETs are limited to relatively low switching frequencies (e.g., 1 MHz or less). Accordingly, it is desirable to have a device structure that is an improvement over super-junction, shield structure, and gate-to-drain thick oxide transistors that achieve low on-state resistance with minimal increase in device capacitance and relatively high breakdown voltages even when using thinner oxide layers between structures.

SUMMARY OF THE INVENTION

The present technology may best be understood by referring to the following description and accompanying drawings that are used to illustrate embodiments of the present technology that are directed toward adaptive charge compensated MOSFET device and method of manufacturing.

In one embodiment, the adaptive charge compensated MOSFET device includes a drift region disposed on the drain region. A plurality of body regions are disposed on the drift region opposite the drain region. A plurality of source regions are disposed on the plurality of body regions opposite the drift region, and are adjacent a plurality of gate structures. Each of a plurality of field plate structures are disposed between a set of body regions and extending partially into the drift region. Each field plate structure includes a plurality of field plate insulator regions, a plurality of field plate regions, and a field ring region. The plurality of field plates are interspersed between the plurality of field plate insulators. The field ring region is disposed between the plurality of field plate regions and the adjacent set of body regions, such that a first field plate is coupled to the plurality of body regions and the plurality of source regions by a source/body/field plate contact. Each of the other field plates are coupled to the field ring through gaps between the field plate insulators. Each of a plurality of gate structures are disposed between a set of field plate stacks. Each gate structure includes a plurality of substantially parallel elongated gate regions and a plurality of gate insulator regions. The plurality of substantially parallel elongated gate regions extend through the plurality of source regions and body regions and partially into the drift region. The plurality of gate insulator regions are disposed between a respective one of the plurality of gate regions and the plurality of source regions, the plurality of body regions and the drift region.

In another embodiment, a method of manufacturing the adaptive charge compensated MOSFET device includes forming a semiconductor layer lightly doped with a first type of dopant on a semiconductor layer heavily doped with the first type of dopant. A plurality of field plate stack trenches are formed in the semiconductor layer lightly doped with the first type of dopant. A field ring is fabricated by forming a semiconductor region heavily doped with a second type of dopant in the semiconductor layer lightly doped with the first type of dopant along the walls of the field plate stack trenches. A first field plate insulator is fabricated by forming a first dielectric layer in the field plate stack trenches. A first field plate is fabricated by forming a first semiconductor layer heavily doped with the second type of dopant on the first field plate insulator in the field plate stack trenches, wherein a portion of the first field plate contacts a first portion of the field ring. A second field plate insulator is fabricated by forming a second dielectric layer on the first field plate in the field plate stack trenches. A second field plate is fabricated by forming a second semiconductor layer heavily doped with the second type of dopant on the second field plate insulator in the field plate stack trenches, wherein a portion of the second field plate contacts a second portion of the field ring. A plurality of gate trenches are then formed in the semiconductor layer lightly doped with the first type of dopant. Gate insulators are fabricated by forming a dielectric layer in the gate trenches. Gates are fabricated by forming a semiconductor layer heavily doped with the first type of dopant on the gate insulator in the gate trenches. Body regions are fabricated by forming a semiconductor region moderately doped with the second type of dopant in the semiconductor layer lightly doped with the first type of dopant opposite the semiconductor layer heavily doped with the first type of dopant, and between the gate insulators and the field rings. It is appreciated that the remaining portion of the semiconductor layer lightly doped with the first type of dopant forms the drift region, and the semiconductor layer heavily doped with the first type of dopant forms the drain region. A source region is fabricated by forming a semiconductor region heavily doped with the first type of dopant in the body regions opposite the drift region, and adjacent the gate insulators, but separated from the field rings by the body regions.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIG. 7 shows a simulation of the electric field contours for a conventional shield device.

FIGS. 8A and 8B show a simulation comparison of the breakdown IV of the adaptive charge balanced MOSFET with field plates and the conventional super-junction device.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

It is appreciated that the structures shown in the Figures are not to scale. The figures are for the purpose of illustrating embodiments of the present technology. It is appreciated that the structures may have different dimension, both absolute and relative, may have regular or irregular edges, boundaries, and/or the like characteristics, features, properties, and/or parameters.

Figure 2A:
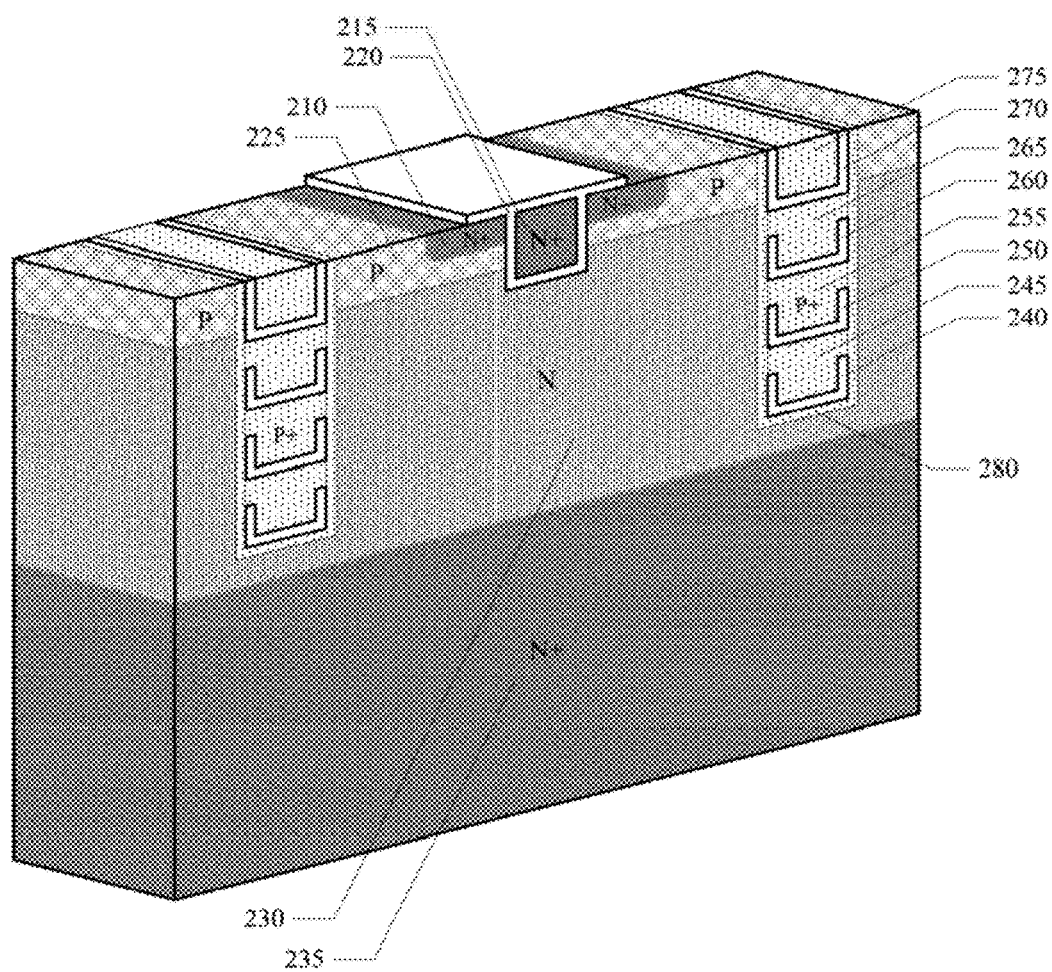
FIG. 2A shows a cross sectional perspective view of an adaptive charge balanced MOSFET, in accordance with one embodiment of the present technology.

Referring now to FIG. 2A, an adaptive charge balanced metal-oxide-semiconductor field effect transistor (MOSFET), in accordance with one embodiment of the present technology, is shown. The MOSFET includes a plurality of source regions 210, a plurality of gate regions 215, a plurality of gate insulator regions 220, a plurality of body regions 225, a drift region 230, a drain region 235, a plurality of field plate stacks 240-280. The MOSFET also includes one or more other structures such as gate contacts, source/body/field plate contacts, a drain contact, encapsulation layers and the like, which are not shown in this figure to better illustrate embodiments of the present technology.

The source regions 210, the gate regions 215, the gate insulator regions 220, the body regions 225, and field plate stacks 240-280 are disposed on the drift region 230 opposite the drain region 235. The gate regions 215 and the gate insulator regions 220 are formed as substantially parallel-elongated structures. Each gate insulator region 220 surrounds a corresponding gate region 215, electrically isolating the gate region 215 from the surrounding source 210, body 225 and drift regions 230. The gate regions 215 are interconnected (not shown) and form the plurality of striped cells. The combination of each gate region 215 and surrounding gate insulator region 220 are referred to herein after as the gate structures. The gate structures 215, 220 extend through the body regions 225 and may extend partially into the drift region 230. The field plate stacks 240-280, formed as substantially parallel-elongated structures, are disposed between the gate structures 215, 220. The field plate stacks 240-280 are disposed through the body regions 225 and extend partially into the drift region 230 deeper than the gate structures 215, 220. The regions 210-225 between each set of field plate stacks 240-280 are referred to hereinafter as the inter-stack mesa region. The source regions 220 are formed along the periphery of the gate insulator regions 220 and are separated from the field plate stacks 240-280 by the body regions 225. The body regions 225 also separate the source regions 210 from the drift region 230 along the periphery of the gate insulator regions 220. The portion of the body regions 225 separating the source regions 210 from the drift region 230 form the source-to-drain channel of the device.

Each field plate stack 240-280 includes a plurality of field plate regions 745, 255, 265, 275 separated from each other by a plurality of field plate insulator regions 240, 250, 260, 270. The set of field plate regions 245, 255, 265, 275 and field plate insulator regions 240, 250, 260, 270 are surrounded by one or more field, rings 280. In each field, plate stack, the field plate regions 245, 255, 265, 275 are laterally separated from the field ring 280 by the field plate insulator regions 240, 250, 260, 270 in some regions and are connected to the field ring 280 in other regions. However, each field plate region 245, 255, 265, 275 makes ohmic contact to the field ring 280, or respective one of the plurality of field rings, wherein the field plate regions 245, 255, 265, 275 are connected to the one or more field rings 280. If the set of field plate regions 245, 255, 265, 275 and field plate insulator regions 740, 250, 760, 270 are surrounded by a single field ring 280, as illustrated, the field ring 280 is disposed between the field plates 245, 255, 265, 275 and the surrounding body region 225 and drift region 230. If the set of field plate regions 245, 255, 265, 275 and field plate insulator regions 240, 250, 260, 270 are surrounded by a plurality of field, rings 280, each field ring 280 is disposed between a corresponding field plate 245, 255, 265, 275 and the surrounding body region 240, 250, 260, 270 and drift region 230.

Figure 2B:
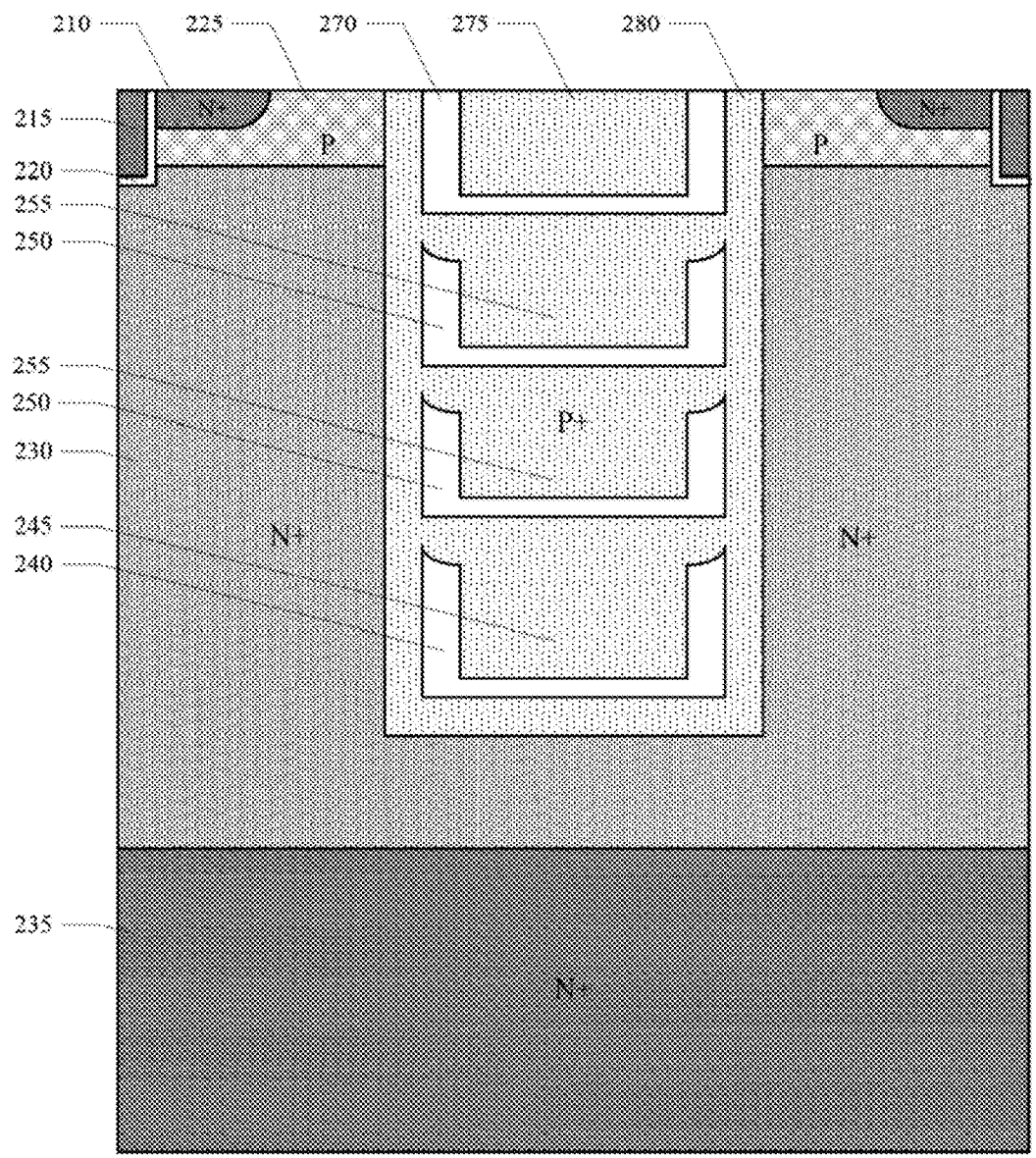
FIG. 2B shows an expanded view of the field plate structure in FIG. 2A, in accordance with one embodiment of the present technology.

Referring now to FIG. 2B, an expanded view of the field plate structure in FIG. 2A, in accordance with one embodiment of the present technology. Again, each field plate stack 240-280 includes a plurality of field plate regions 745, 255, 265, 275 separated from each other by a plurality of field plate insulator regions 240, 250, 260, 270. The set of field plate regions 245, 255, 265, 275 and field, plate insulator regions 240, 250, 260, 270 are surrounded by a field ring 280. In each field plate stack, the field plate regions 745, 255, 765, 275 are laterally separated from the field ring 280 by the field plate insulator regions 240, 250, 260, 270 in some regions and are connected to the field ring 280 in other regions. It is appreciated that although the top field plate region 275 is shown to be surrounded by the corresponding field plate insulator region 270, the top field plate region 275 may alternatively be connected to the field ring 280 because the corresponding field plate insulator region 270 does not extend to the top surface in some implementations. In an exemplary embodiment, a top field plate and field plate insulator region may extend through the body region 225 into the drift region 230 beyond the depth of the gate structure 215, 220. The thickness (vertically as illustrated in the Figures) of the field plate insulator regions 240, 250, 260, 270 may be selected to achieve substantially equal electric field potential steps down through the drift region 230. One or more further dimensions of the field plate regions 245, 255, 265, 275 the field plate insulator regions 240, 250, 260, 270, the gaps there between, and/or the like may likewise be varied to achieve one or more particular design criteria. Again, it is appreciated that the structures shown in FIGS. 2A and 2B are not to scale.

In one implementation, as illustrated in FIG. 2A, the field plate regions 245, 255, 265, 275 may be p-doped (P) semiconductor, such as polysilicon doped with boron. The one or more field rings of each stack may be p-doped (P) semiconductor, such as silicon doped with boron. The field plate insulator regions 240, 250, 260, 270 may be a dielectric such as silicon dioxide. The source regions 210 and the drain region 235 may be heavily n-doped (+N) semiconductor, such as silicon doped with phosphorous or arsenic. The body regions 225 may be p-doped (P) semiconductor, such as silicon doped with boron. The field ring 280 and field plate regions 245, 255, 265, 275 are more heavily doped than the body regions 225. The gate regions 220 may be heavily n-doped semiconductor (N+), such as polysilicon doped with phosphorous or arsenic. The gate insulator regions 220 may be a dielectric, such as silicon dioxide. The drift region 235 may be lightly n-doped (N−) semiconductor, such as silicon doped with phosphorous or arsenic.

In another implementation, the field plate regions may be n-doped (N) semiconductor, such as polysilicon doped with phosphorous or arsenic. The one or More field rings of each stack may be n-doped (N) semiconductor, such as silicon doped with phosphorous or arsenic. The field plate insulator regions may be a dielectric such as silicon dioxide. The source regions and the drain region ma be heavily p-doped (+P) semiconductor, such as silicon doped with boron. The body regions may be n-doped (N) semiconductor, such as silicon doped with phosphorous or arsenic. The field ring and field plate regions are more heavily doped than the body regions. The gate regions may be heavily p-doped (P+) semiconductor, such as polysilicon doped with boron. The gate insulator regions may be a dielectric, such as silicon dioxide. The drift region may be lightly p-doped (P−) semiconductor, such as silicon doped with boron.

The breakdown voltage of the device is dependant upon the number of field plates 240, 250, 260, 270 in the stack and the depth of the field plate stack. The breakdown voltage is also dependant upon width of the mesa, $W_{mesa}$, between the field plate stacks, and the doping profile of the source, body and drift regions 210, 225, 230 and the semiconductor material itself (e.g. silicon, gallium arsenic). For the case of an n-type doped drift region 230, a thin more heavily doped p-type field ring region 280 is connected to the moderately p-type doped body region 225. The doping level of the p-type dope field ring region 280 is chosen so that it is depleted of flee charge carriers when the applied dram voltage is low enough, compared to the body-drift region breakdown voltage. The p-type field ring 280 is adapted to achieve a smoothly graded, preferably linear increasing, potential along its depth from source 210 to drift region 230 starting from a low drain-to-bottom-of field plate stack voltage.

The thickness, $W_{FP}$, of the field plate regions 245, 255, 265, 275, laterally separated from the field ring 280 and body region 225 by the field plate insulator regions 240, 250, 260, 270 is selected, taking into consideration the thickness, $T_{insulator}$, of the field plate insulator regions 240, 250, 260, 270, to achieve substantially small electric field peaks in the body regions 225 for a given breakdown voltage of the MOSFET device. The thickness, $T_{insulator}$, of the field plate insulator regions 240, 250, 260, 270, also governs the number of field plates 245, 255, 265, 275, for achieving a given breakdown voltage of the device while maintaining a relatively low device on-resistance, $R_{DS-on}$, and low electric fields in the body regions 225. The thickness, $T_{fp-c}$, of the field plate regions 245, 255, 265, 275 in ohmic contact with the body region 225 or Schottky contact with the drift region 230 through the field ring 280 is selected so that the contact area is enough for the field plate regions 245, 255, 265, 275, to be able to float to the potential level of the body regions 225 at the area of contact. In addition, it is appreciated that the potential of the source regions 210 is coupled to the body regions 225, a top field plate 275, and field ring 280 through the source/body/field plate contact (not shown).

In the Off-state, as the drain voltage is increased beyond the pinch-off voltage needed to deplete the source-to-drain channel of the body region 225 proximate the gate structure 215, 220, the potential drops across the length of the depletion region increasing from the source side to the drain side of the channel. Depending upon the potential drop profile along the channel, the adjacent field plate regions 245, 255, 265, 275 in the field plate stacks float to different potentials depending upon their position with respect to the source 210 and drain regions 235.

Figure 3:
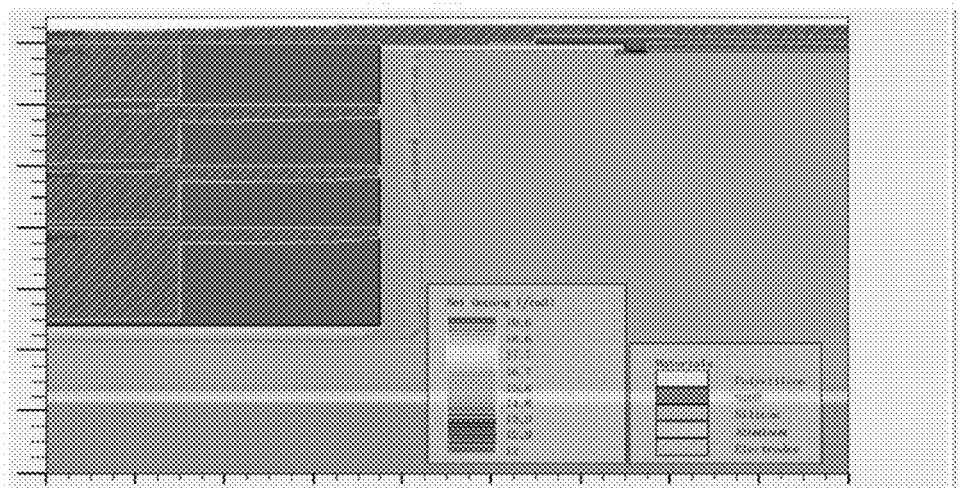
FIG. 3 shows a simulation plot of the half cell structure and doping profile an exemplary adaptive charge balanced MOSFET device, in accordance with embodiments of the present technology.
Figure 4:
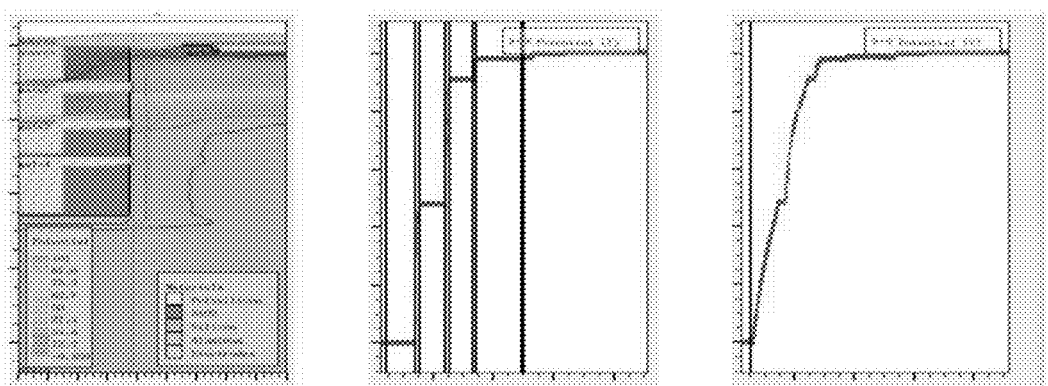
FIG. 4 shows a simulation potential contour plot for an exemplary adaptive charge balanced MOSFET device at 100V.
Figure 5:
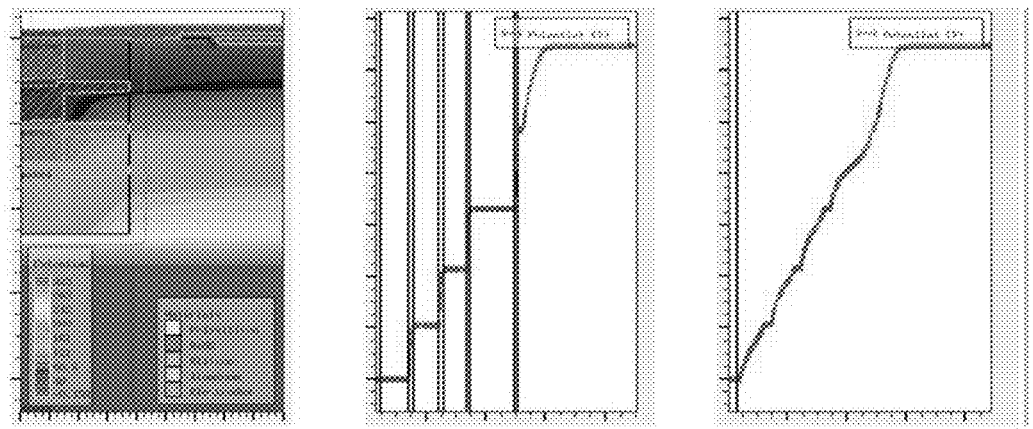
FIG. 5 shows a simulation potential contour plot for an exemplary adaptive charge balanced MOSFET device at breakdown.

Referring now to FIG. 3, the half cell structure and doping profile an exemplary adaptive charge balanced MOSFET device, in accordance with embodiments of the present technology, is illustrated. Referring now to FIGS. 4 and 5, potential contour plots for an exemplary adaptive charge balanced MOSFET device at 100Y and breakdown voltage respectively are shown. The first field plate coupled to the source/body/field plate contact is at the potential of the source and body regions. The succeeding field plate regions float to incrementally higher potentials such that the field plate region closest to the drain region floats to the highest potential. As the field plate regions float to potential smaller than the potential in the body regions, they start to deplete the body regions. The first field plate at the source potential depletes the body region charge and, as the depletion region reaches the second field plate, the second field plate floats to a voltage smaller than the potential (e.g., drain potential) of the un-depleted body region of a convention MOSFET without field plate stacks. The smaller potential of the second field plate then aids in depleting the body region to a point where the depletion region reaches a next field plate, which in turn floats to a smaller voltage than the drain potential of the convention MOSFET without field plate stacks. This process of depletion extension and field plate floating to successively increasing potential continues until the whole body region is depleted. Once the whole body region is depleted, further increase in potential doesn't necessarily increase the depletion region much further leading to high fields and the breakdown of the structure.

It is appreciated that as the field plates float to a voltage closer to the potential of the body region, electric fields in the field plate insulator regions separating the field plates and the body regions are smaller for thin insulators. In conventional shielded gate or source device, by contrast, a thick insulator is needed to achieve small electric fields in the same regions as the field plate stack, because the shield plates are at gate or source potential and hence at a much larger potential difference. In other words, due to the large potential difference between shielding in conventional devices and field plates in the present embodiment, thicker insulators are needed to achieve higher breakdown voltages along with increasing the depth of the mesas between the gate structures of conventional devices. However, in embodiments of the present technology, as the potential difference between field plates and the mesa regions is smaller as described above, a higher breakdown voltage can be achieved by thinner insulator regions and deeper mesa regions. It should also be appreciated that due to the smaller potential difference between field plates and the body regions, device charge or capacitance is smaller for devices with field plate structures as compared to conventional shield devices.

Figure 6:
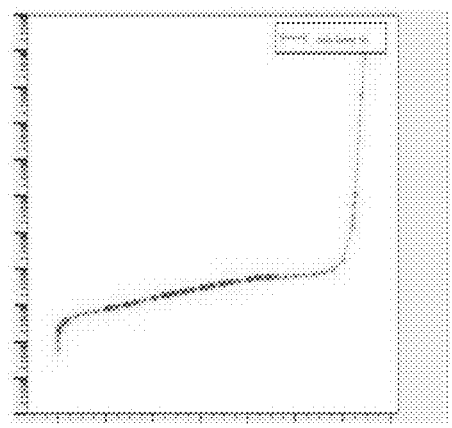
FIG. 6 shows a simulation IV curve of an exemplary adaptive charge balanced MOSFET device, in accordance with embodiments of the present technology.

Referring, now to FIG. 6, an IV curve of an exemplary adaptive charge balanced MOSFET device, in accordance with embodiments of the present technology is shown. As illustrated, the breakdown voltage achieved in using the field plate stack is relatively large for a given insulator thickness, trench depth and body region doping profile. Referring now to FIG. 7, the electric field contours for a conventional shield device demonstrates that the breakdown happens proximate the trench bottom due to the thin oxide thickness. It is appreciated that a low breakdown voltage is also a result of the hole inversion layer formed at the oxide-silicon interface. Inversion voltage is a function of the oxide thickness and doping profile in the mesas between the gate structures. A thin p-doped body region along with multiple field plates which float to successively higher potentials along the channel from source to drain in embodiments of the present technology helps to avoid the inversion layer formation, resulting in a higher breakdown voltage.

Care should, however, be taken to avoid inversion of the n-type drift region in the mesas next to the field plate regions. In the case of the formation of an inversion layer in the drift region of mesa area next to the field plate, the breakdown voltage of the device will be less than a device with a continuous thin p-type field ring. In addition, the charge in the continuous thin p-type field ring can be varied to tune the contribution of the super-junction diode to the overall breakdown voltage enhancement of the field plate structure and hence provide a way to tweak the electric field in the device in accordance with embodiments of the present technology.

The field plate regions should make ohmic contact to the p-type field ring and body regions. In the case where a field plate is coupled to the drift region in the mesas, the field plate should make Schottky contact in order to be able to tune the device to have a high breakdown voltage even with high doping profiles in the mesas.

Referring now to FIG. 7, the electric field contours for a conventional super-junction device are shown for a device with a trench depth and oxide thickness simile to the adaptive charge balanced. MOSFET device shown in FIG. 6. Referring now to FIGS. 8A and 8B, the breakdown IV of the adaptive charge balanced MOSFET with field plate is qualitatively compared to the conventional super-junction device.

Referring now to FIGS. 9A-9E, a method of fabricating an adaptive charge balanced MOSFET, in accordance with one embodiment of the present technology, is shown. The method of fabrication will be further explained with reference to FIGS. 10A-10M, which show various stage of the charge balanced MOSFET during fabrication. Again, it is appreciated that the structures shown in FIGS. 10A-10M are not to scale.

The process begins at 302 with various initial processes upon a semiconductor wafer, such as cleaning, depositing, doping, etching and/or the like. The wafer may be a first substrate semiconductor layer 402 doped with a first type of dopant at a first concentration. In one implementation, the first substrate semiconductor layer may be silicon heavily doped with phosphorous (N+).

At 304, a second substrate semiconductor layer doped with the first type of dopant at a second concentration 404 is formed upon the first substrate semiconductor layer 402. In one implementation, the second substrate semiconductor layer may be epitaxial deposited on the first substrate semiconductor layer. The epitaxial deposited silicon may be doped by introducing the desired impurity, such as phosphorous or arsenic, into the reaction chamber. In one implementation, the epitaxial deposited second substrate semiconductor layer may be silicon lightly doped with phosphorous (N−).

At 306, a hard mask layer 406 is deposited on the second substrate semiconductor layer doped 404. In one implementation, the hard mask layer 406 may be silicon nitride or the like. At 308, a field plate trench mask 408 is formed on the hard mask layer 406. The field plate trench mask 408 may be formed by depositing a photo-resist and patterning the resist by any well-known lithography process. In one implementation, the field plate mask 408 has a plurality of longitudinal parallel openings (e.g., striped).

At 310, the portions of the hard mask. 406 and a portion of the second substrate semiconductor layer 404 exposed by the field plate trench mask 408 are etched. The hard mask 408 and the second substrate semiconductor layer 404 may be etched by one or more well-known isotropic etching methods. A plurality of field plate stack trenches 410 are formed having inter-field plate mesas disposed between the trenches 410. In one implementation, the field plate stack trenches 410 have a depth of approximately D, a width of approximately W, and are spaced apart from each other by approximately S. At 312, the field plate stack trench mask 408 is removed utilizing an appropriate resist stripper or a resist ashing process.

Figure 10A:
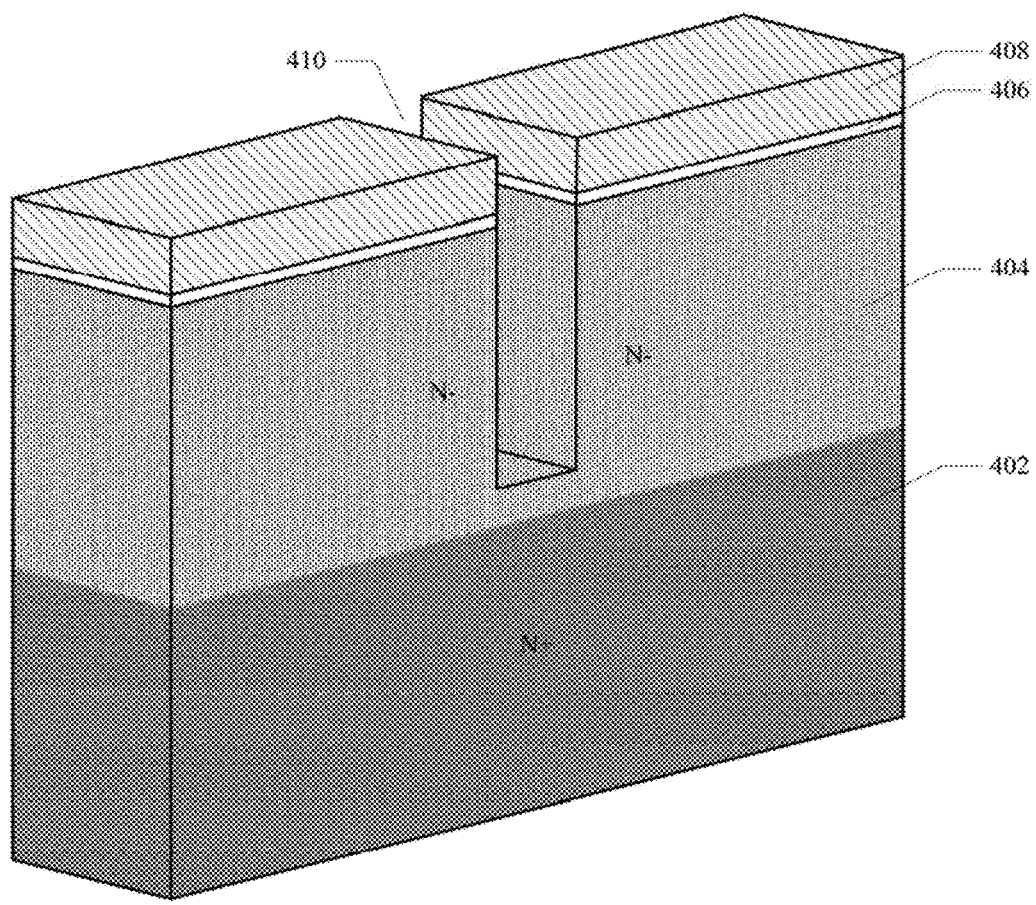
FIGS. 10A-10M show a block diagram of various stages of the charge balanced MOSFET during fabrication, in accordance with one embodiment of the present technology.
Figure 10B:
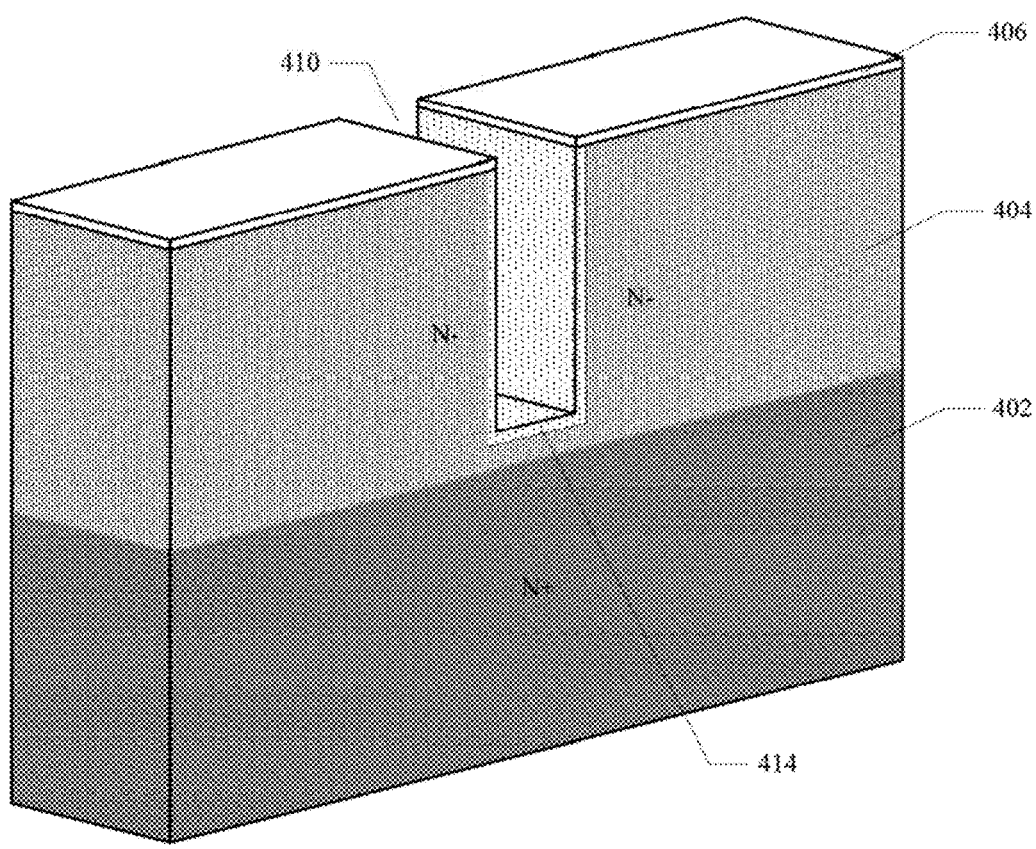

Referring now to FIG. 10B, field rings 414 are formed in the second substrate semiconductor layer 404 along the plurality of field plate trenches 410, at 314. The field rings 414 doped with the second type of dopant at a third concentration. In one implementation a dopant of the second type is implanted at an angle utilizing any well-known ion-implant processes to form the filed plate rings 414 along, the walls and floor of the plurality of field plate stack trenches 410. The hard mask 406 prevents implanting in the rest of the mesas between the field plate stack trenches 410. In one implementation, boron is ion-implanted along the walls and floor of the field plate stack trenches 410 to form the field rings 414 having a width of approximate, $W_{ring}$.

Figure 9A:
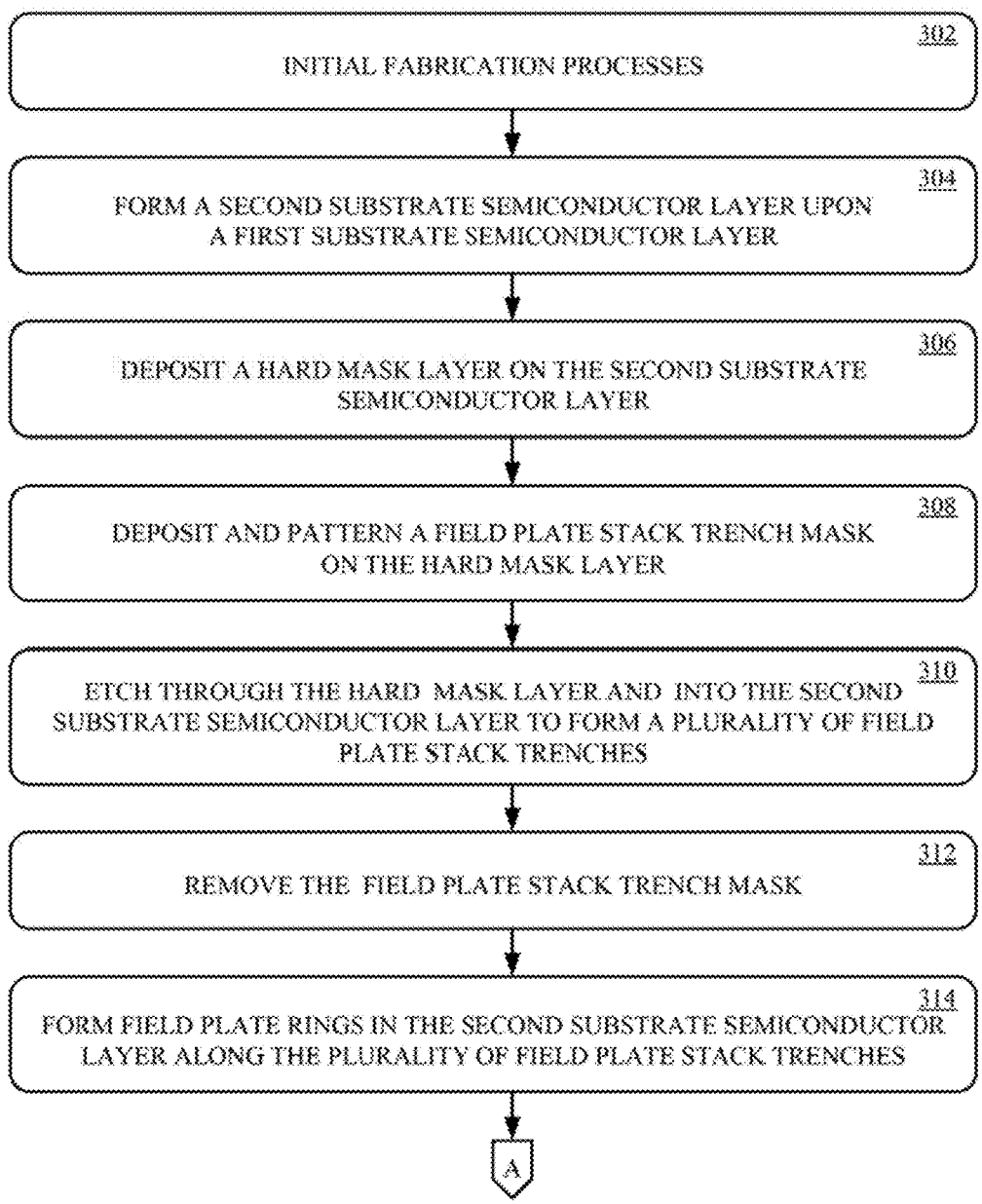
FIGS. 9A-9E show a flow diagram of a method of fabricating an adaptive charge balanced MOSFET, in accordance with one embodiment of the present technology.
Figure 9B:
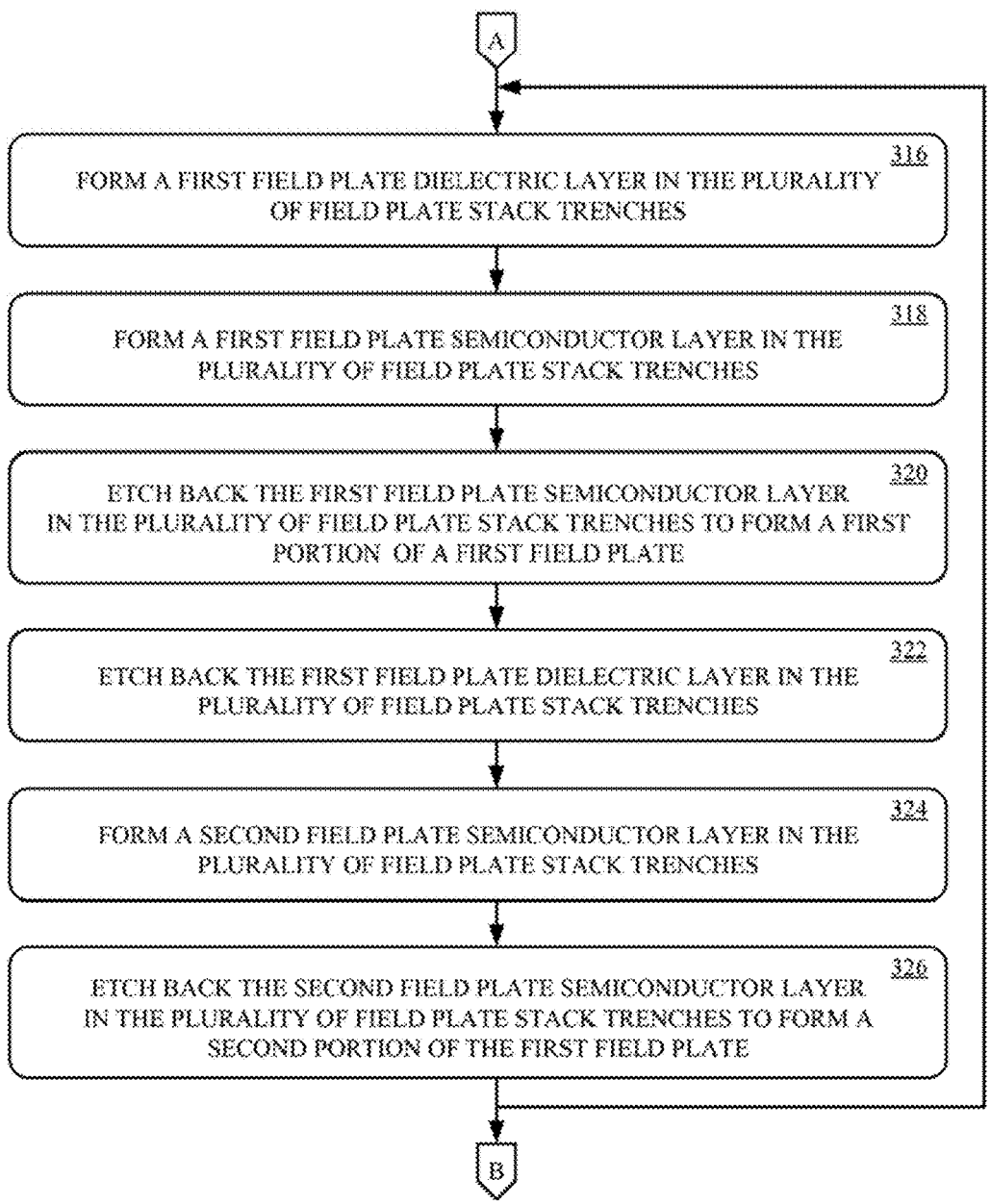
Figure 10C:
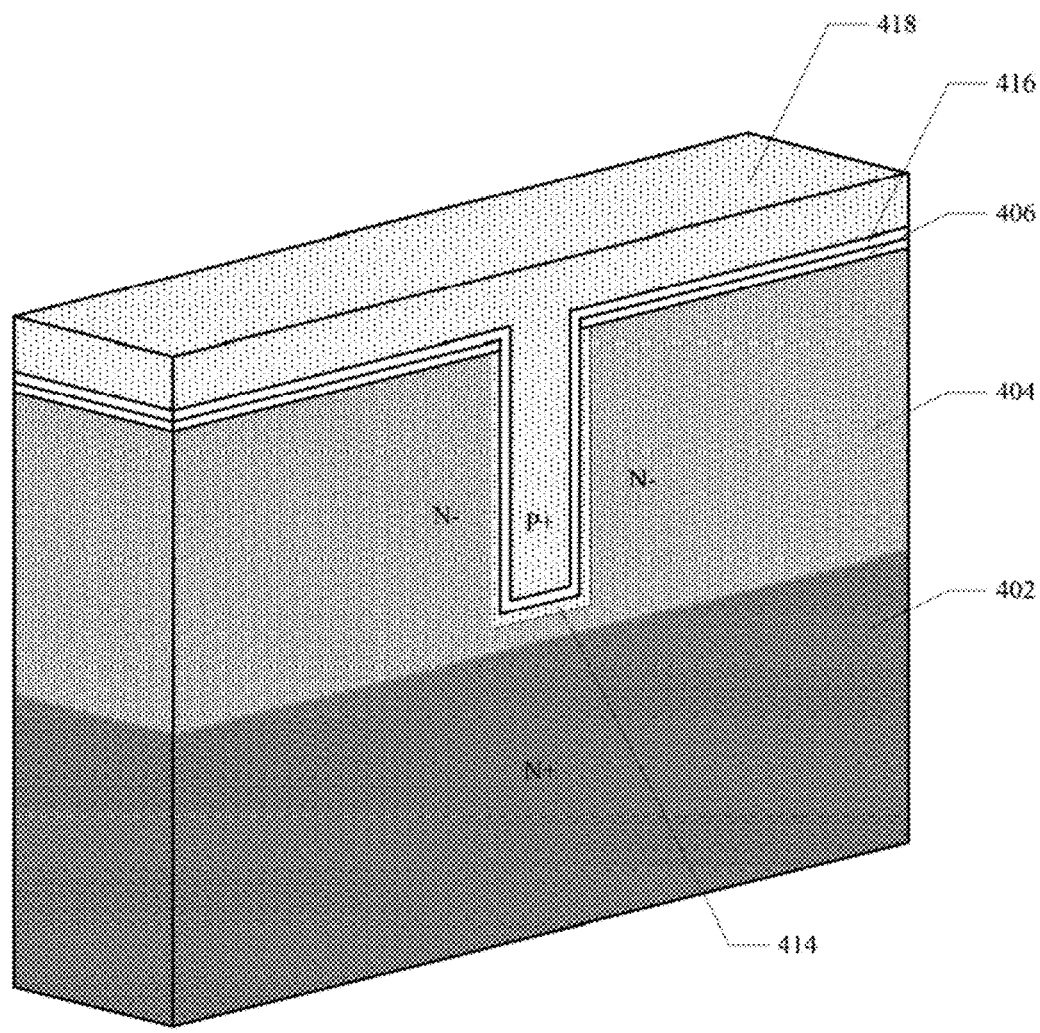

Referring now to FIGS. 9B and 10C, a first field plate dielectric layer 416 is formed in the plurality of field plate stack trenches 410, at 316. The dielectric may be formed by oxidizing the second substrate semiconductor layer 404 along the walls and floor of the plurality of field plate stack trenches 410. In one implementation, the dielectric layer 418 may be silicon oxide having a thickness, $T_{insulator}$. At 318, a first field plate semiconductor layer 418 is formed on the first field plate dielectric layer 416 in the plurality of field plate stack trenches 410. The first field plate semiconductor layer 418 is doped with the second type of dopant at a fourth concentration. In one implementation, the first field plate semiconductor layer 418 may be formed by conformally depositing polysilicon doped with boron.

Figure 10D:
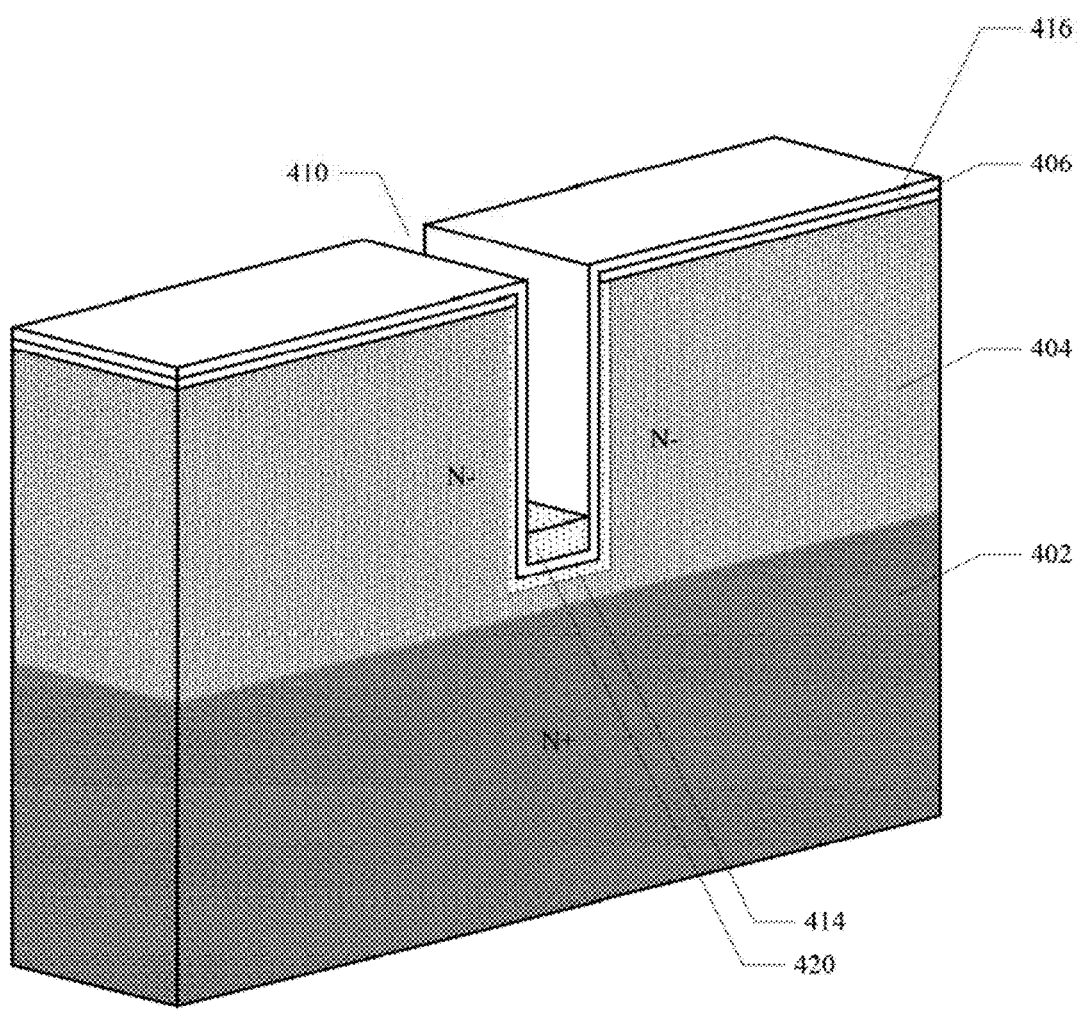

Referring now to FIG. 10D, the first field plate semiconductor layer 418 is etching back into the plurality of field plate stack trenches 410 to form a first portion of a field plate 420, at 320. The first portion of the field plate 420 has a thickness, $T_{fp-nc}$. The first field plate semiconductor layer 418 may be etched back by any well-known selective etching process.

Figure 10E:
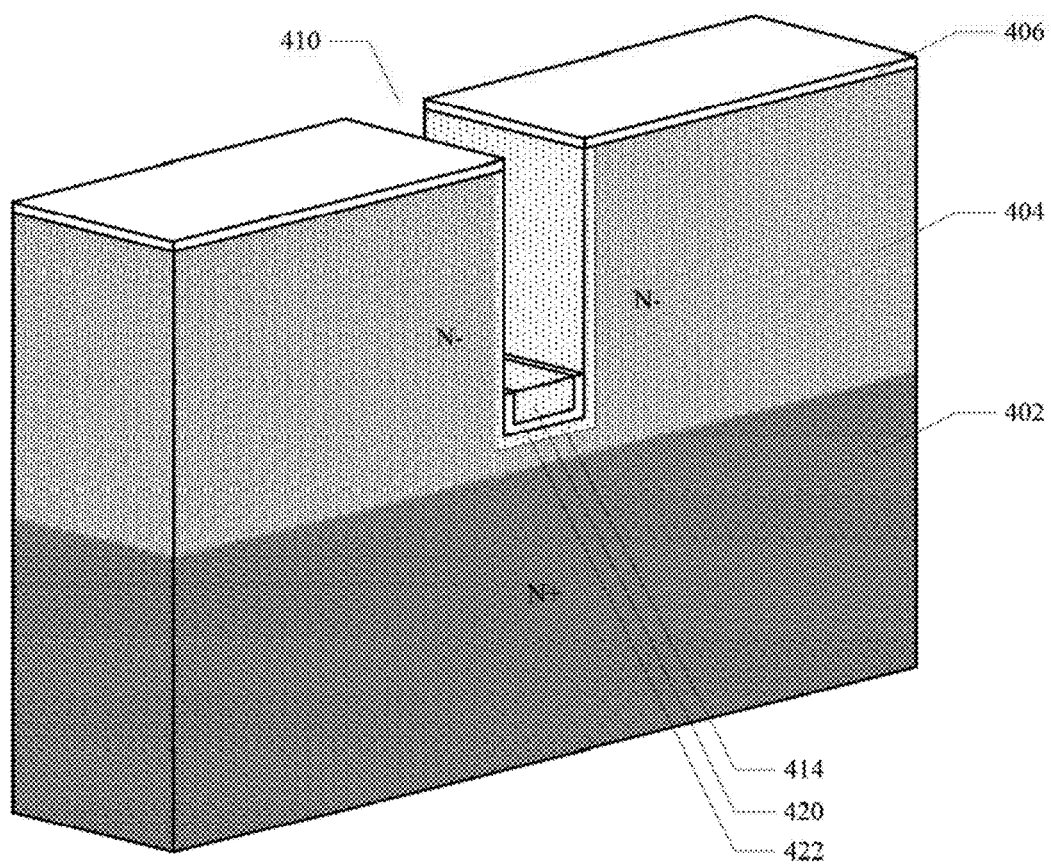

Referring now to FIG. 10E, the first field plate dielectric layer 416 is etched back into the plurality of field plate stack trenches 410 to form a first field plate insulator 422, at 322. The first field plate dielectric layer 416 may be etched back by any well-known selective etching process.

Figure 10F:
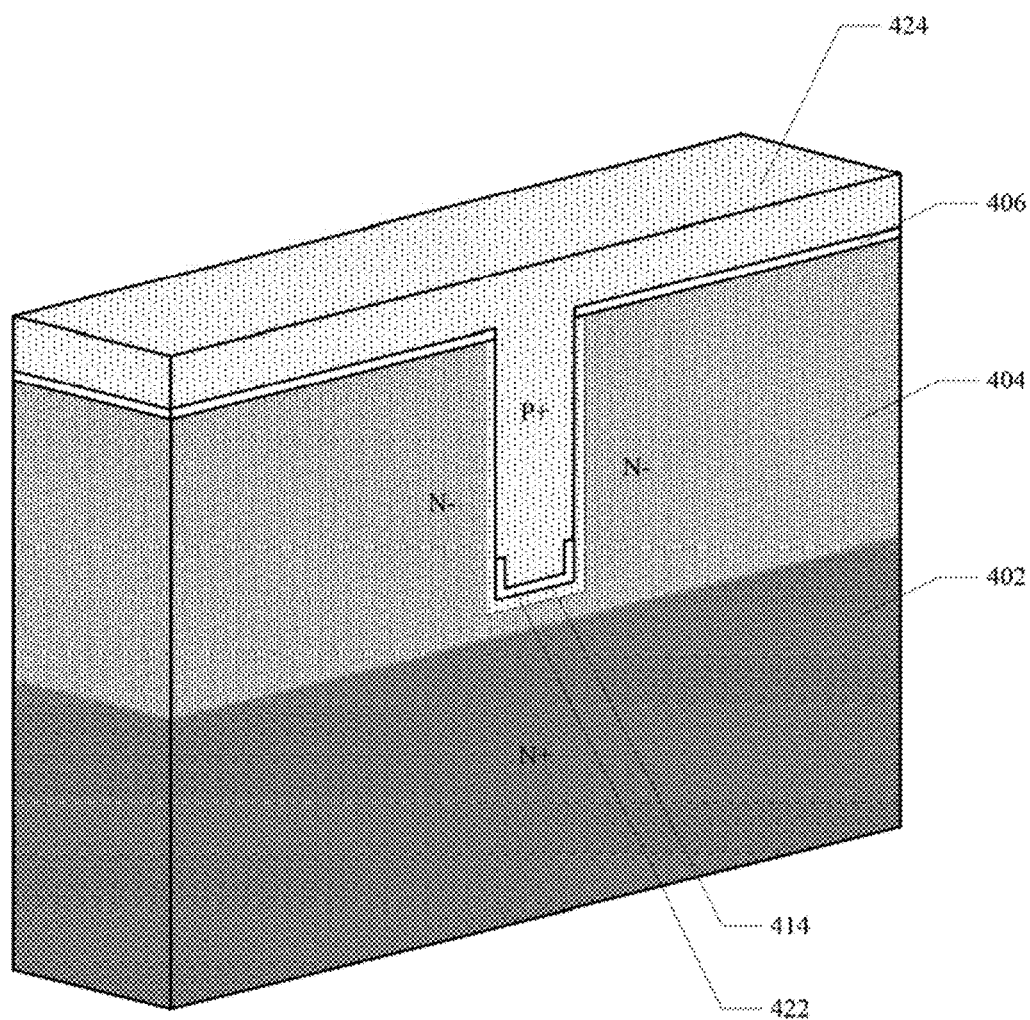

Referring now to FIG. 10F, a second field plate semiconductor layer 424 is formed on the first portion of the field plate 420 and first field plate insulator 422 in the plurality of field plate stack trenches, at 324. In one implementation, the second field plate semiconductor 424 may be formed by conformally depositing a p-doped polysilicon.

Figure 10G:
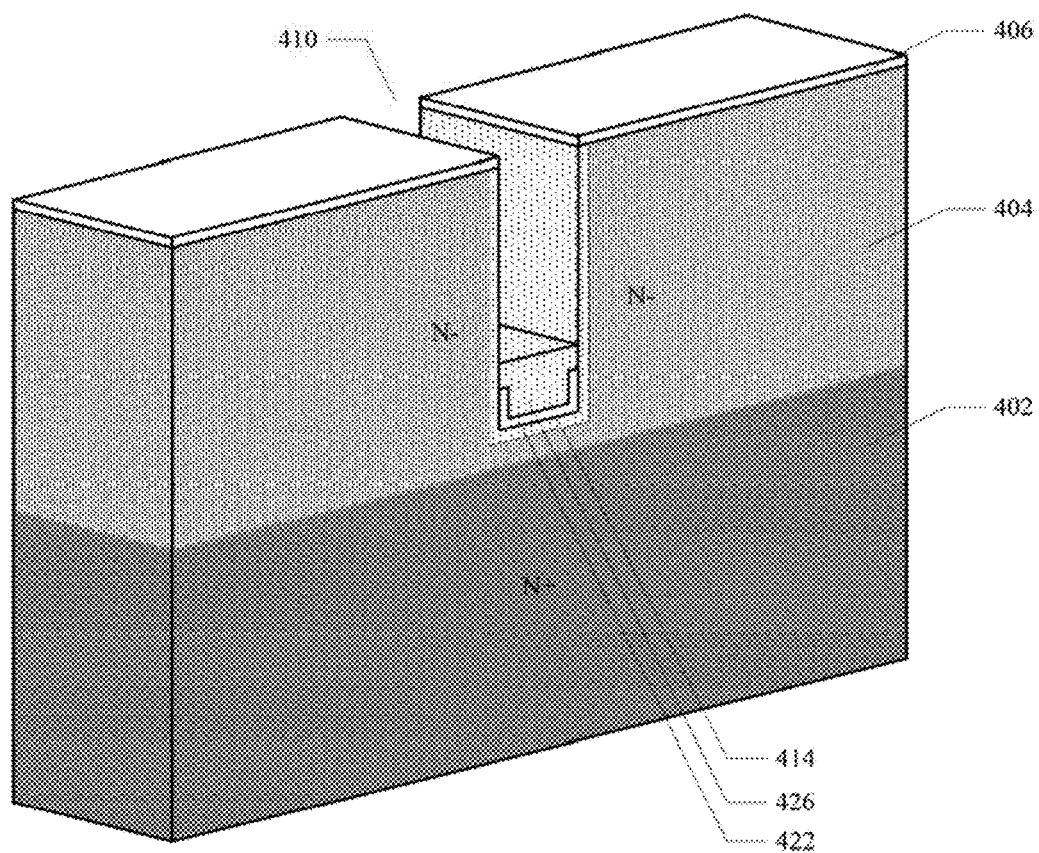

Referring now to FIG. 10G, the second field plate semiconductor layer 424 is etching back into the plurality of field plate trenches 410 to form a second portion of the first field plate 426, at 326. The resulting field plate has a thickness, $T_{fp}$. The second field plate semiconductor layer 424 may be etched back by any well-known selective etching process. The processes of 316-326 are repeated to form a plurality of field plates 426, separated from each other by a plurality of field plate insulators 422.

Figure 9C:
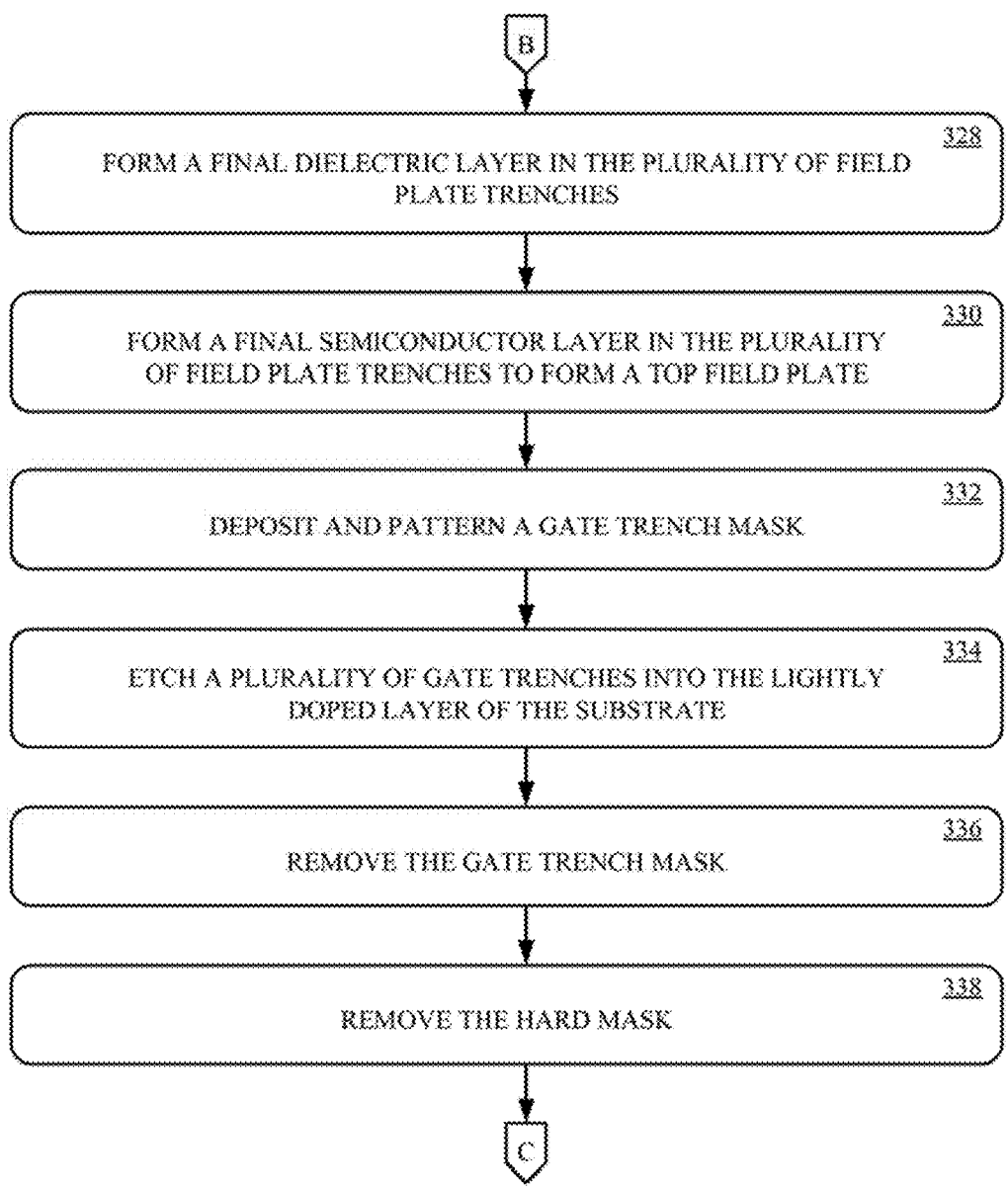
Figure 10H:
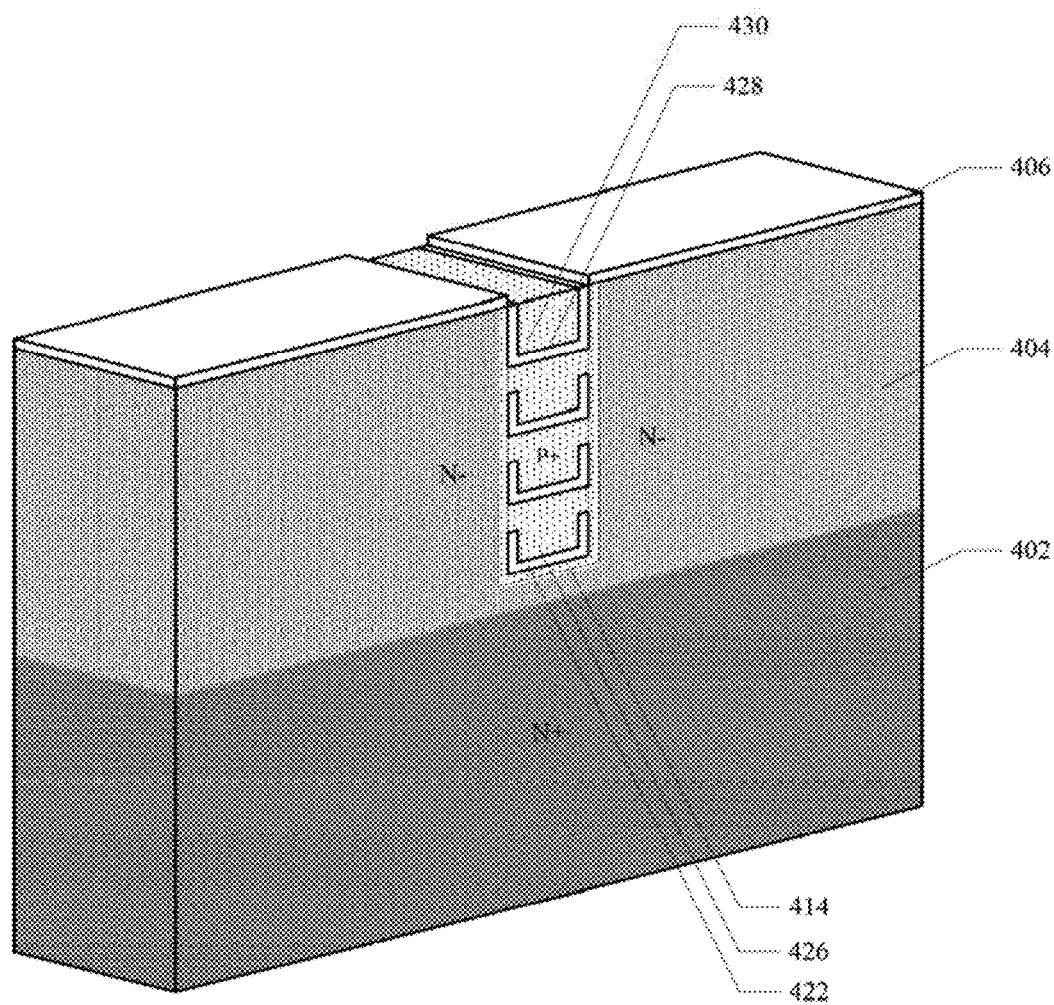

Referring now to FIGS. 9C and 10H, a final field plate dielectric layer 428 is formed in the plurality of field plate trenches, at 328. The final field plate dielectric layer may be formed by oxidizing the second substrate semiconductor layer 404 along the remaining portions of the walls of the plurality of field plate stack trenches 410. In one implementation, the final dielectric layer may be silicon oxide having a thickness, $T_{insulator}$. At 330, a final field plate 430, doped with the second type of dopant at a fourth concentration, is formed on the final field plate dielectric layer 428 in the plurality of field plate stack trenches 410. The final field plate 430 may be formed by conformally depositing a semiconductor and etching it back to the top of the plurality of field plate stack trenches 410 to form the final field plate 430. The set of field plates 428, 430 and interposed field plate insulators 422, 428 in each field plate stack trench 410, along with the field ring 414 are referred to herein as a field plate stack.

Figure 10I:
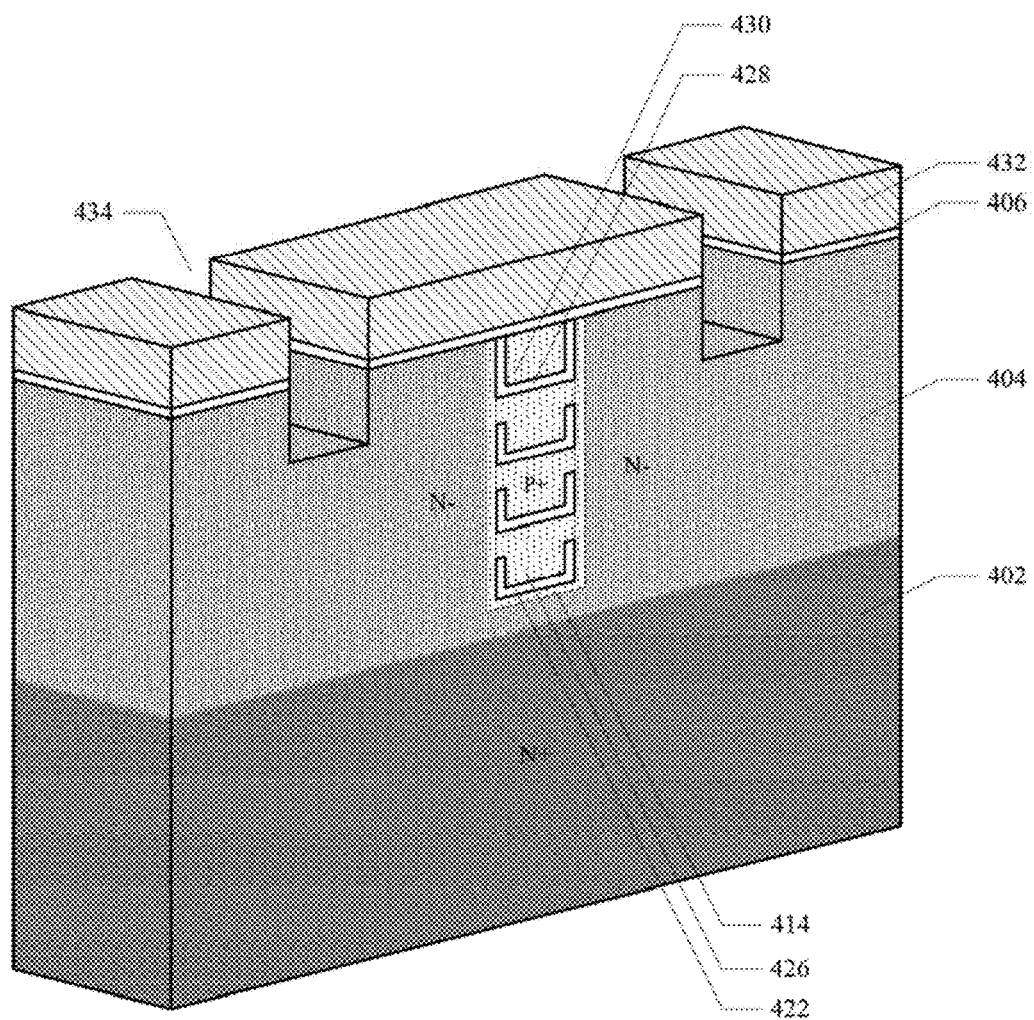
Figure 10J:
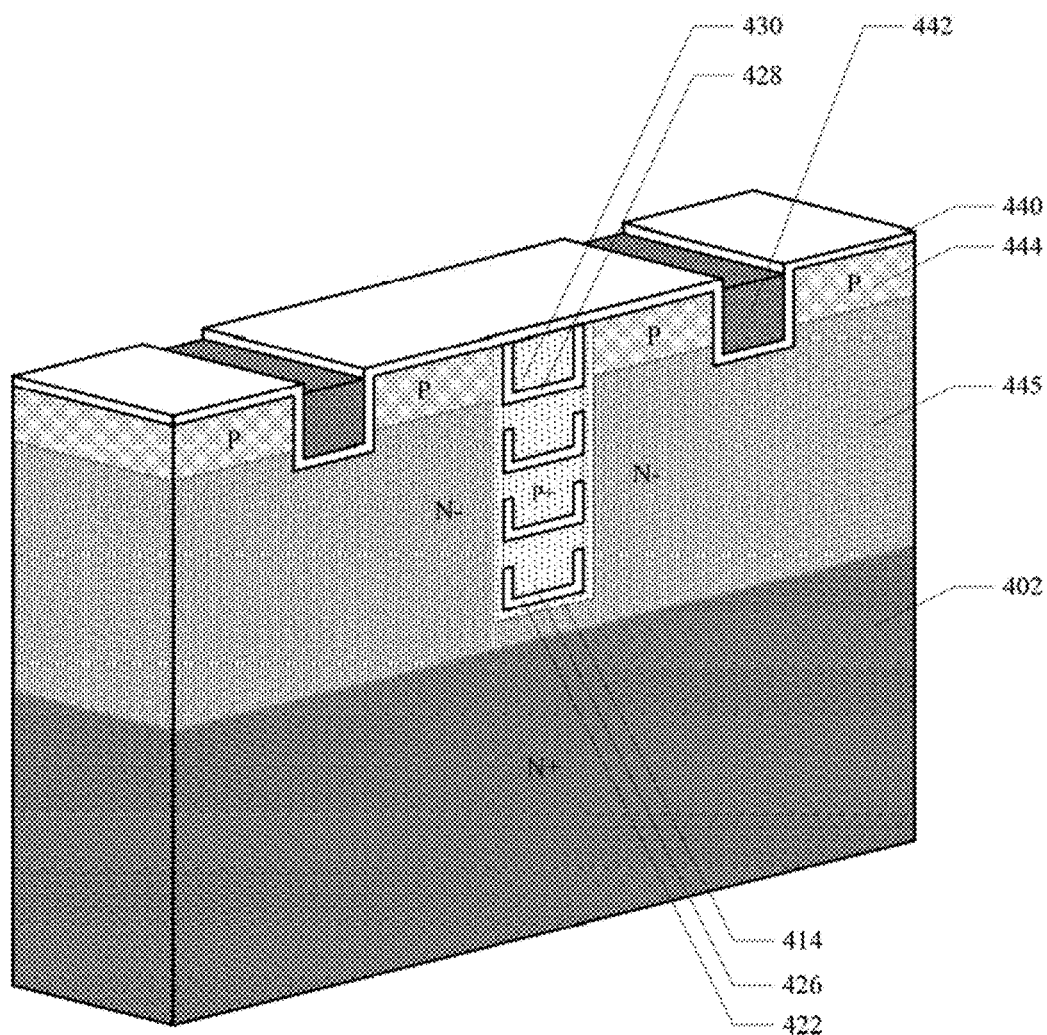

Referring now to FIG. 10I, a gate trench mask 432 is formed on the hard mask 406, at 332. The gate trench mask 432 may be formed by depositing a photo-resist and patterning the resist by any well-known lithography process. In one implementation, the gate trench mask 432 includes a plurality of longitudinal parallel openings (e.g., striped) having a width, $W_{gate}$, and spaced between and substantially parallel to the plurality of field plate stacks. At 334, the hard mask 406 and a portion of the second substrate semiconductor layer 404 exposed by the gate trench mask 432 are etched to form a plurality of gate trenches 434. The hard mask 406 and the second substrate semiconductor layer 404 may be etched by one or more well-known isotropic etching methods. In one implementation, the gate trenches have as depth, $D_{gate}$, and a width, $W_{gate}$. At 336, the gate trench mask 432 is removed utilizing an appropriate resist stripper or a resist ashing process. At 338, the hard mask 405 is removed utilizing any well-known selective etching process.

Figure 9D:
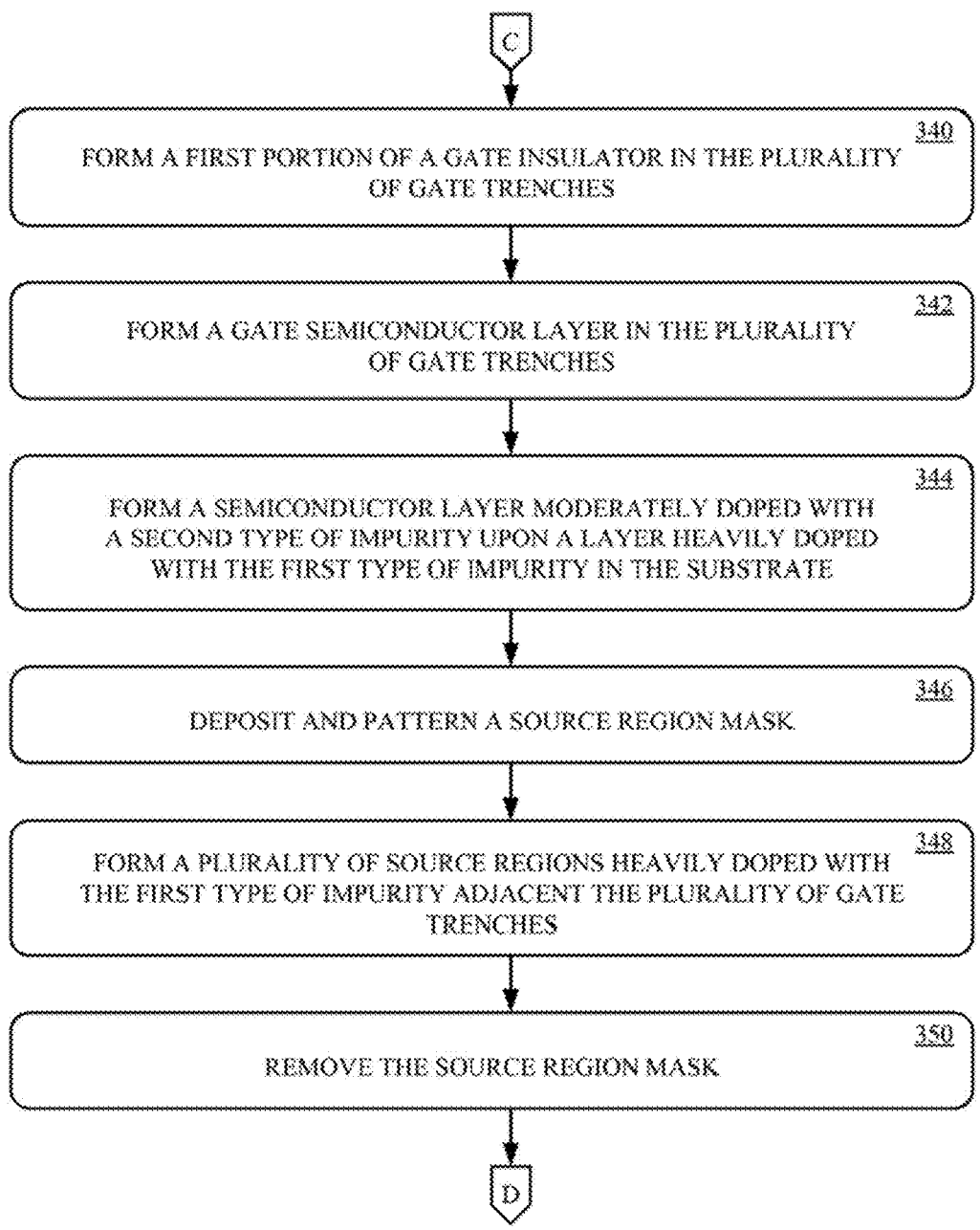

Referring now FIGS. 9D and 10I, a first portion of a gate insulator 440 is formed in the plurality of gate trenches 434, at 340. The first portion of the gate insulator 440 may be formed by oxidizing the second substrate semiconductor layer 404 along the wall and floor of the plurality of gate trenches 434, in one implementation, the dielectric layer may be silicon oxide having a thickness, $T_{gate}$. At 342, a gate layer 442 is formed in the plurality of gate trenches 434. The gate layer 442 may be formed by conformally depositing a semiconductor layer doped with the first type of dopant at a fifth concentration and then etching back to the top of the gate trenches 434. In one implementation, the gate layer 442 may be polysilicon doped with phosphorous or arsenic. At 344, a plurality of body regions 444 is formed in the second substrate semiconductor layer 404 between the plurality of gate structures and field plate stacks, and opposite the first substrate semiconductor layer 402. The body regions may be formed by implanting the second type of dopant at a sixth concentration to a predetermined depth in the second substrate semiconductor layer 404. The first substrate semiconductor layer 440 forms the drain of the device, while the remaining portion of the second substrate semiconductor layer between the body regions 444 and the drain region 402 forms the drift region of the device 445. In one implementation, the body regions may be silicon moderately doped with boron (P).

Figure 10K:
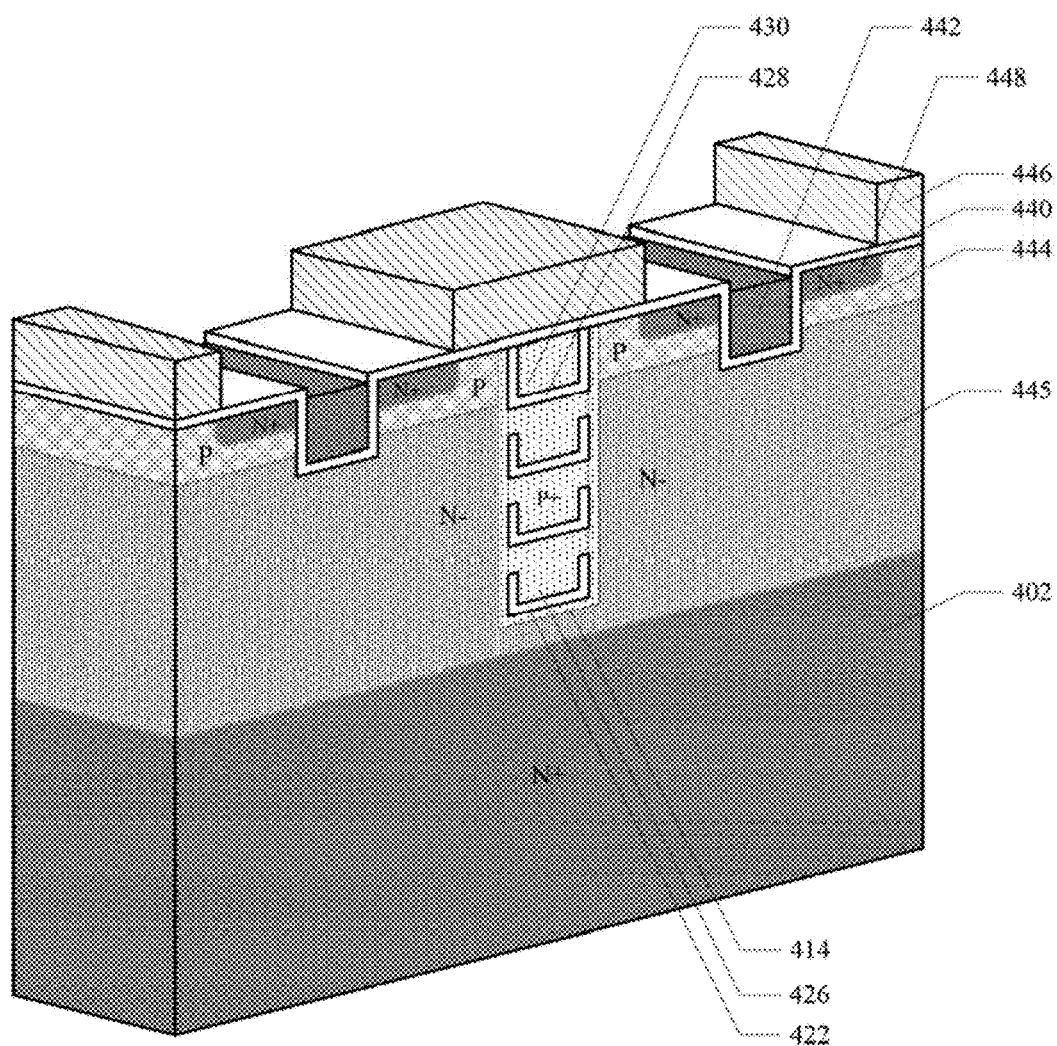

Referring now to FIG. 10K, a source region mask 446 is formed on the gate insulator, at 346. The source region mask 446 may be formed by depositing a photo-resist and patterning the resist by any well-known lithography process. In one implementation, the source region mask 446 includes a plurality of longitudinal parallel openings (e.g., striped) with a width, $W_S$, extending beyond each side of the gate trenches 434. At 348, source regions 448 are formed in the body regions 444 adjacent each side of the plurality of gate structures. The source regions 448 may be formed by implanting the first type of dopant to a predetermined depth in the body regions 444. In one implementation, the source regions 448 may be silicon heavily doped with phosphorous or arsenic (N+). At 350, the source region mask is removed utilizing an appropriate resist stripper or a resist ashing process.

Figure 9E:
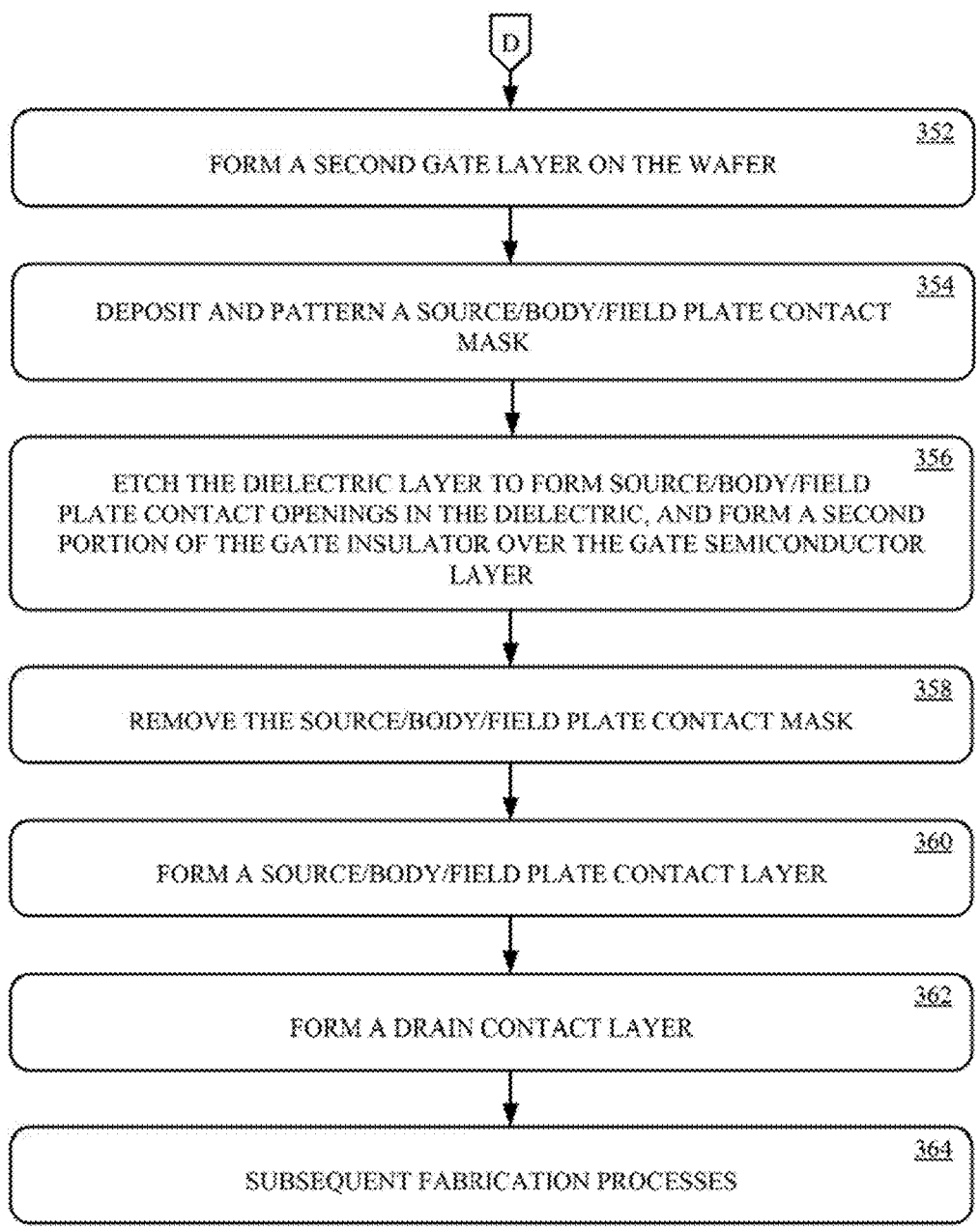
Figure 10L:
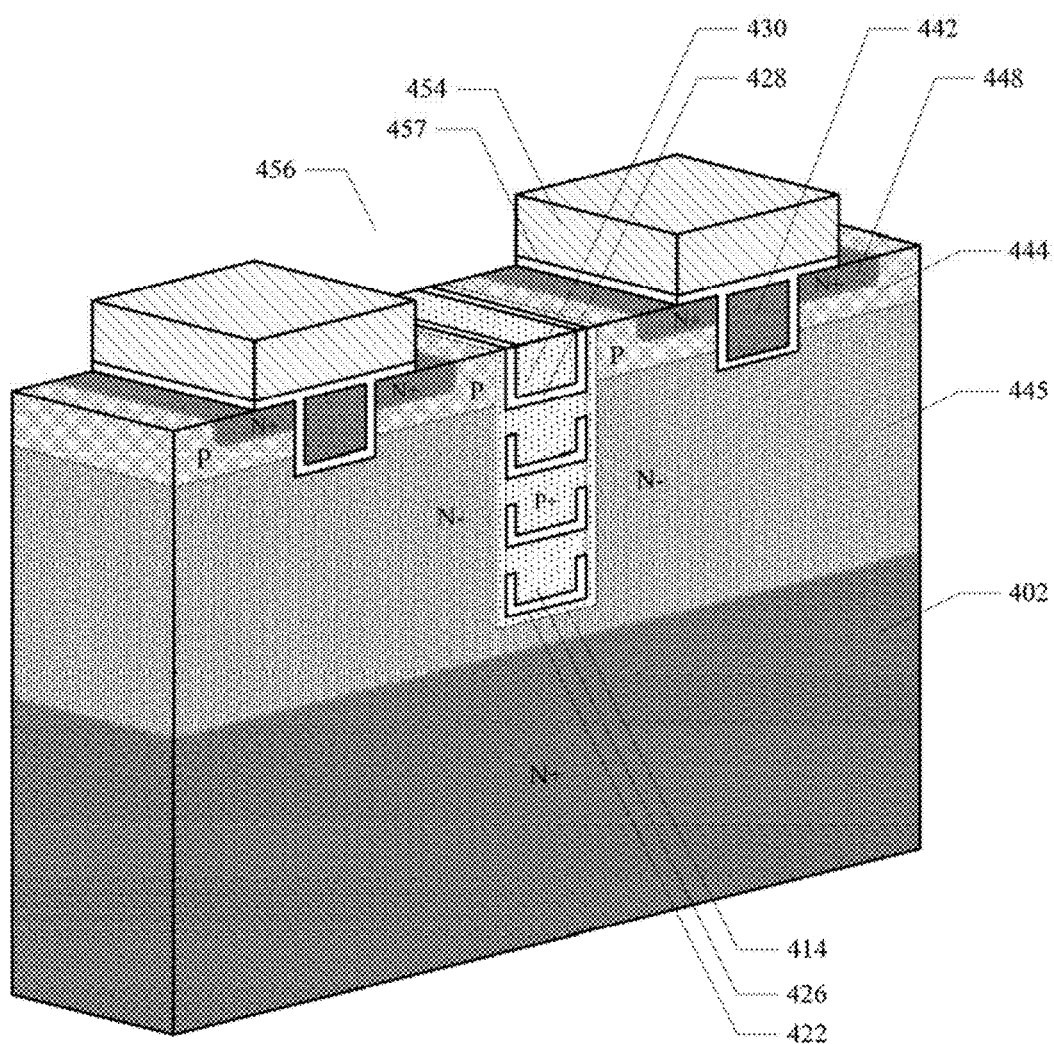

Referring now to FIGS. 9E and 10L, a second gate layer 452 is formed on the wafer, at 352. The dielectric layer may be formed by oxidizing the surface of the wafer. At 354, a source/body/field plate contact mask 454 is formed. The source/body/field plate contact mask 454 may be formed by depositing a photo-resist and patterning the resist by any well-known lithography process. At 356, the dielectric layer exposed by the source/body/field plate contact mask 454 is etched to form source/body filed plate contacts 456 in the dielectric and to form a second portion of the gate insulator 457 over the gate semiconductor layer. At 358, the source/body/field plate contact mask 454 is removed utilizing an appropriate resist stripper or a resist ashing process.

Figure 10M:
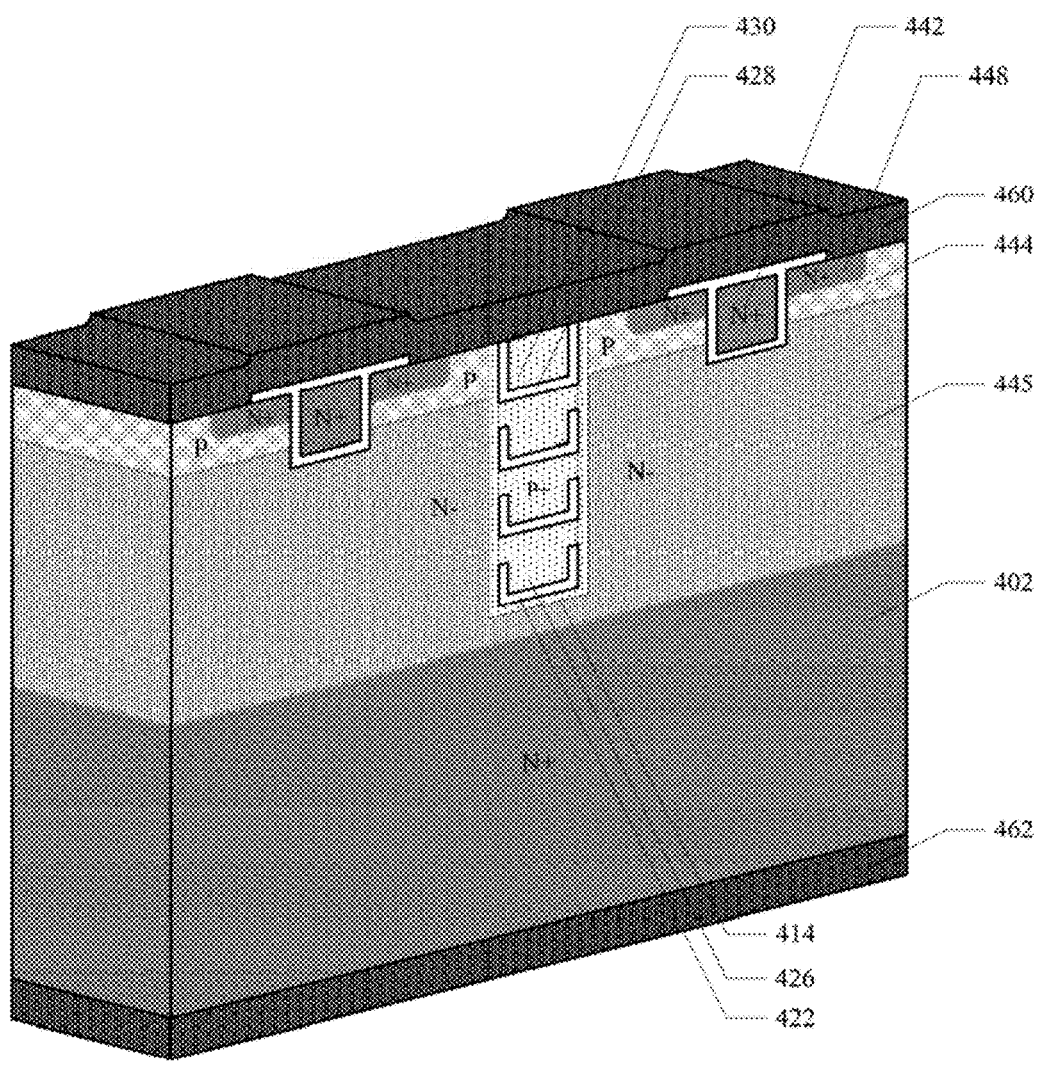

Referring now to FIG. 10M, a source/body/field plate contact layer 460 is formed, at 360. In one implementation, the source/body/field plate contact layer 460 may be formed by depositing a metal layer by any well-known method such as sputtering. At 362, drain contact layer 462 is formed on the opposite side of the wafer. Again, the drain contact layer 462 may be formed by depositing a metal layer by any well-known method such as sputtering. At 364, fabrication continues with various other processes. The various processes typically include etching, deposition, doping, cleaning, annealing, passivation, cleaving and/or the like.

Figure 1:
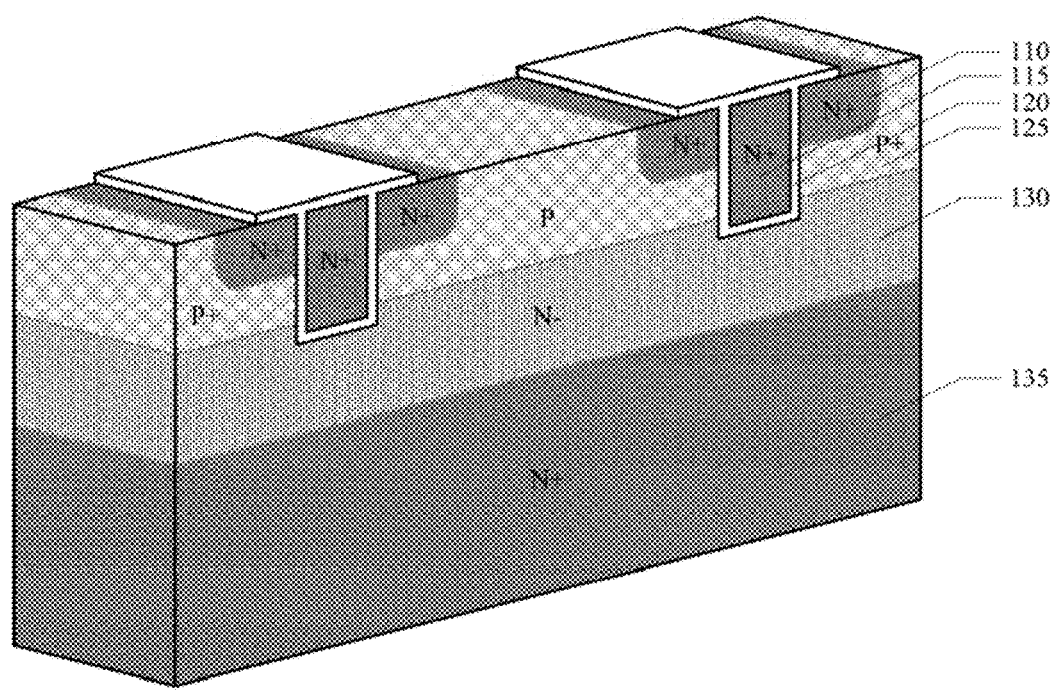
FIG. 1 shows a cross sectional perspective view of a basic trench MOSFET according to the conventional art.
Figure 11:
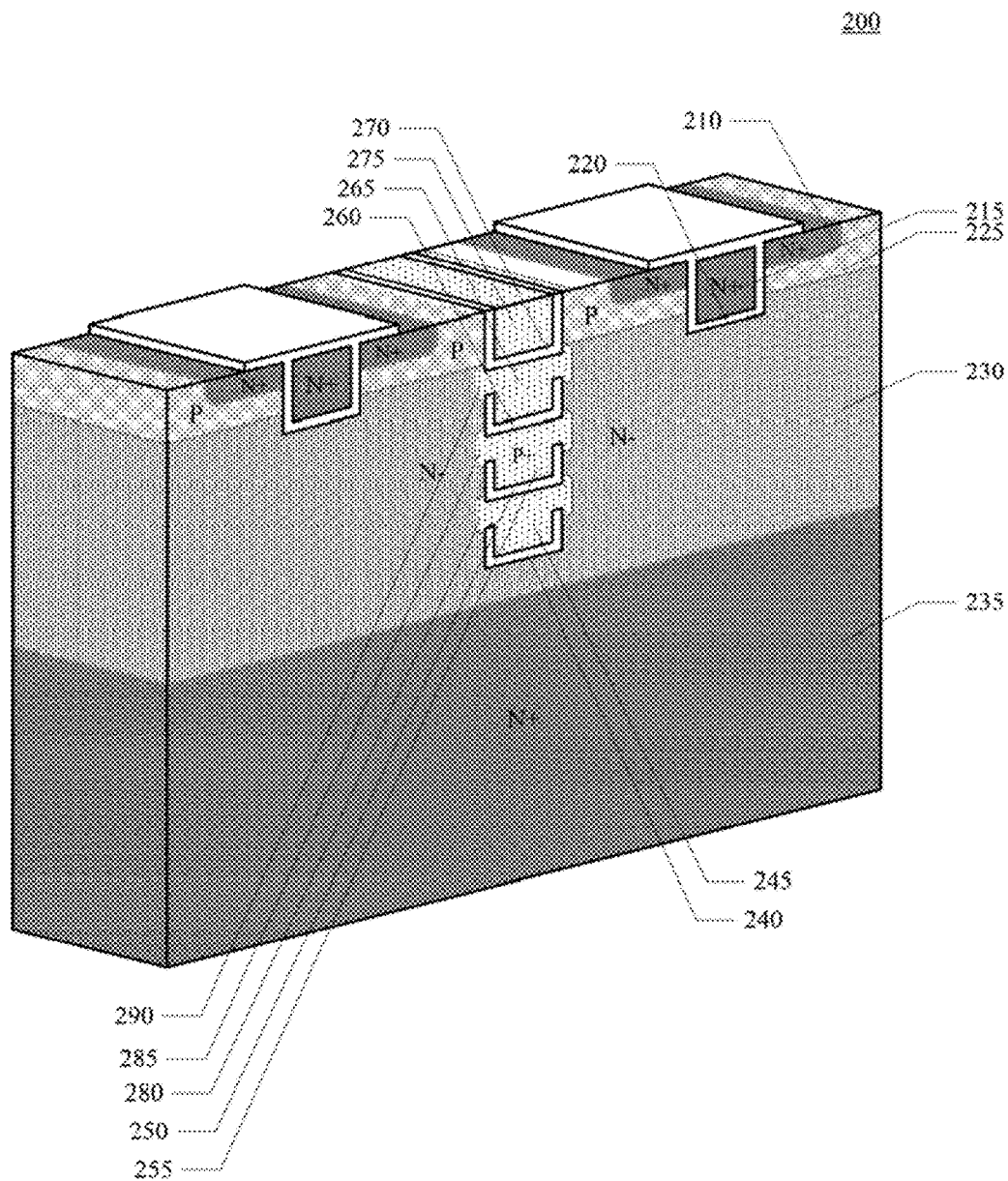
FIG. 11 shows a cross sectional perspective view of an adaptive charge balanced. MOSFET, in accordance with another embodiment of the present technology.

Referring to FIG. 1 an adaptive charge balanced MOSFET, in accordance with another embodiment of the present technology, is shown. Again, it is appreciated that the structures shown in FIG. 11 are not to scale. The field plate stack structures of the charge balanced MOSFET each include a plurality of field rings 280, 285, 290. Each field ring 280, 285, 290 is disposed between a corresponding field plate 245, 255, 265, 275 and the surrounding body region 240, 250, 260, 270 and drift region 230. The field rings 280, 285, 290 may be formed by out diffusion from the field plates 245, 255, 265, 275 into the adjacent body region 225 or drift region 230.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:
1. An apparatus comprising:
   a drain region;
   a drift region disposed on the drain region;
   a plurality of body regions disposed on the drift region opposite the drain region;
   a plurality of source regions disposed on the plurality of body regions opposite the drift region;
   a plurality of gate structures, wherein each gate structure includes:
      a plurality of substantially parallel elongated gate regions extending through the plurality of source regions and the plurality of body regions and extending partially into the drift region; and
      a plurality of gate insulator regions each disposed between a respective one of the plurality of gate regions and the plurality of source regions, the plurality of body regions and the drift region; and a plurality of field plate structures, wherein each field plate structure is disposed through the body regions and extending into the drift region, wherein each gate structure is disposed between a set of field plate structures, and wherein each field plate structure includes:
a plurality of field plate insulator regions;
a plurality of field plate regions, wherein the plurality of field plate regions are interspersed between the plurality of field plate insulator regions; and
a field ring region disposed between the plurality of field plate regions and the adjacent drift regions, and wherein regions of a set of field plates are laterally separated from the field ring region by the plurality of field plate insulator regions and other regions of the set of field plates are coupled to the field ring region;
wherein the plurality of gate structures are adjacent the plurality of source regions, the plurality of body regions and the drift regions.

2. The apparatus according to claim 1, wherein:
the drain region comprises a heavily n-doped semiconductor;
the drift region comprises a moderate n-doped semiconductor;
the plurality of body regions comprise a moderately p-doped semiconductor;
the plurality of source regions comprise a heavily n-doped semiconductor;
the plurality of field plate regions comprise a heavily p-doped semiconductor; and
the field ring region comprises a heavily p-doped semiconductor.

3. The apparatus according to claim 1, wherein:
the drain region comprises a heavily p-doped semiconductor;
the drift region comprises a moderately p-doped semiconductor;
the plurality of body regions comprise a moderately n-doped semiconductor;
the plurality of source regions comprise a heavily p-doped semiconductor;
the plurality of field plate regions comprise a heavily n-doped semiconductor;
the field ring region comprises a heavily n-doped semiconductor.

4. The apparatus according to claim 1, wherein the field ring region comprises multiple portions wherein two or more portions of the field ring region are coupled to a corresponding field plate region.

5. The apparatus according to claim 1, further comprising a source/body/field plate contact disposed on the source region, the body region and one of the plurality of field plate regions.

6. The apparatus according to claim 1, wherein the plurality of field plate regions are in Schottky contact with the drift region increasing a breakdown voltage of the apparatus as compared to an ohmic contact.

7. A apparatus comprising: a field plate stack including; a plurality of field plate insulator regions; a plurality of field plate regions, wherein the plurality of field plate regions are interspersed between the plurality of field plate insulator regions; and a field ring region, wherein the plurality of field plate regions are coupled to the field ring region, wherein a thickness of one of the plurality of field plate insulator regions and a thickness of a contact area between one of the plurality of field plate regions and the field ring region are selected so that the one of the plurality of field plate regions and another one of the plurality of field plate regions float to a different potential when a drain voltage is greater than a pinch-off voltage; a gate structure including a gate region surrounded by a gate insulator region; a source region; a drift region; and a body region coupled to the source region, the drift region and the field ring region.

8. The apparatus according to claim 7, wherein the field ring region comprises multiple portions wherein two or more portions of the field ring region each couple a corresponding field plate region to an adjacent portion of the body region.

9. The apparatus according to claim 7, wherein:
the drift region comprises epitaxial silicon moderately doped with phosphorous or arsenic;
the body region comprises silicon moderately doped with boron;
the source region comprises silicon heavily doped with phosphorous or arsenic;
the gate region comprises polysilicon heavily doped with phosphorous or arsenic;
the plurality of field plate regions comprise polysilicon heavily doped with boron; and
the field ring region comprises epitaxial silicon heavily doped with boron.

10. The apparatus according to claim 7, wherein: the drift region comprises epitaxial silicon moderately doped with boron; the body region comprises silicon moderately doped with phosphorous or arsenic; the source region comprises silicon heavily doped with boron; the gate region comprises polysilicon heavily doped with boron; the plurality of field plate regions comprise polysilicon heavily doped with phosphorous or arsenic; and the field ring region comprises epitaxial silicon heavily doped with phosphorous or arsenic.

11. The apparatus according to claim 7, wherein a depth of the field plate stack is greater than a depth of the gate structure.

12. A metal-oxide-semiconductor field effect transistor comprising: a field plate stack including; a plurality of field plate insulator regions; a plurality of field plate regions comprising polysilicon heavily doped with boron, phosphorous, or arsenic, wherein the plurality of field plate regions are interspersed between the plurality of field plate insulator regions; and a field ring region comprising epitaxial silicon heavily doped with boron, phosphorous, or arsenic, wherein the plurality of field plate regions are coupled to the field ring region, wherein a thickness of one of the plurality of field plate insulator regions and a thickness of a contact area between one of the plurality of field plate regions and the field ring region are selected so that the one of the plurality of field plate regions and another one of the plurality of field plate regions float to a different potential when a drain voltage is greater than a pinch-off voltage; a gate structure including a gate region surrounded by a gate insulator region, the gate region comprising polysilicon heavily doped with phosphorous, arsenic or boron; a source region comprising silicon heavily doped with phosphorous, arsenic or boron; a drift region comprising epitaxial silicon moderately doped with phosphorous, arsenic or boron; and a body region coupled to the source region, the drift region and the field ring region; the body region comprises silicon moderately doped with boron, phosphorous or arsenic.

13. The metal-oxide-semiconductor field effect transistor according to claim 12, wherein the field ring region comprises multiple portions wherein two or more portions of the field ring region each couple a corresponding field plate region to an adjacent portion of the body region.

14. The metal-oxide-semiconductor field effect transistor according to claim 12, wherein a depth of the field plate stack is greater than a depth of the gate structure.

* * * * *